United States Patent
Sugaya et al.

(10) Patent No.: US 11,842,905 B2
(45) Date of Patent: Dec. 12, 2023

(54) STACKED SUBSTRATE MANUFACTURING METHOD, STACKED SUBSTRATE MANUFACTURING APPARATUS, STACKED SUBSTRATE MANUFACTURING SYSTEM, AND SUBSTRATE PROCESSING APPARATUS

(71) Applicant: NIKON CORPORATION, Tokyo (JP)

(72) Inventors: Isao Sugaya, Kawasaki (JP); Hajime Mitsuishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 16/244,729

(22) Filed: Jan. 10, 2019

(65) Prior Publication Data

US 2019/0148184 A1    May 16, 2019

Related U.S. Application Data

(63) Continuation of application No. PCT/JP2017/023942, filed on Jun. 29, 2017.

(30) Foreign Application Priority Data

Jul. 12, 2016   (JP) .................. 2016-138029

(51) Int. Cl.
*H01L 21/67*   (2006.01)
*H01L 21/68*   (2006.01)
(Continued)

(52) U.S. Cl.
CPC .. *H01L 21/67092* (2013.01); *H01L 21/67253* (2013.01); *H01L 21/67271* (2013.01);
(Continued)

(58) Field of Classification Search
None
See application file for complete search history.

(56) References Cited

U.S. PATENT DOCUMENTS

| | | | |
|---|---|---|---|
| 6,433,352 B1* | 8/2002 | Oka | G03F 7/70433 |
| | | | 250/559.3 |
| 2006/0085994 A1* | 4/2006 | Yano | G01B 11/306 |
| | | | 33/533 |

(Continued)

FOREIGN PATENT DOCUMENTS

| | | | |
|---|---|---|---|
| JP | 2012-019209 A | 1/2012 |
| JP | 2012-038860 A | 2/2012 |

(Continued)

OTHER PUBLICATIONS

International Search Report dated Mar. 8, 2016 by the Japanese Patent Office in counterpart International Application No. PCT/JP2015/084570, and English translation thereof.

(Continued)

*Primary Examiner* — Xiaoming Liu
(74) *Attorney, Agent, or Firm* — Finnegan, Henderson, Farabow, Garrett & Dunner, L.L.P.

(57) ABSTRACT

A method of manufacturing a stacked substrate by bonding a first substrate and a second substrate, including a step of determining, based on information about curving of each of the first substrate and the second substrate, whether or not the first substrate and the second substrate satisfy a predetermined condition, and, a step of bonding the first substrate and the second substrate if the predetermined condition is satisfied. The stacked substrate manufacturing method described above includes a step of estimating, based on the information, an amount of misalignment which occurs after the first substrate is bonded to the second substrate and the predetermined condition may include that the amount of misalignment is equal to or less than a threshold.

34 Claims, 26 Drawing Sheets

(51) Int. Cl.
　　　H01L 21/66　　　(2006.01)
　　　H01L 21/683　　(2006.01)
　　　H01L 21/687　　(2006.01)
(52) U.S. Cl.
　　　CPC ...... H01L 21/67288 (2013.01); H01L 21/681 (2013.01); H01L 21/6831 (2013.01); H01L 21/68714 (2013.01); H01L 22/20 (2013.01); H01L 22/12 (2013.01)

(56) References Cited

U.S. PATENT DOCUMENTS

| | | | |
|---|---|---|---|
| 2014/0072774 A1* | 3/2014 | Kito | H01L 21/68735 156/196 |
| 2014/0224405 A1 | 8/2014 | Kinouchi et al. | |
| 2015/0083786 A1* | 3/2015 | Okamoto | H01L 21/67092 228/9 |
| 2015/0210057 A1* | 7/2015 | Wagenleithner | B32B 37/0076 156/290 |
| 2017/0278803 A1 | 9/2017 | Sugaya et al. | |
| 2020/0335472 A1 | 10/2020 | Okamoto et al. | |

FOREIGN PATENT DOCUMENTS

| | | |
|---|---|---|
| JP | 2013-098186 A | 5/2013 |
| KR | 10-2014-0038968 | 3/2014 |
| TW | 201351576 A | 12/2013 |
| WO | WO 2015/066232 A1 | 5/2015 |
| WO | WO 2016093284 A1 | 6/2016 |

OTHER PUBLICATIONS

Written Opinion of the International Searching Authority dated Mar. 8, 2016 in counterpart International Application No. PCT/JP2015/084570, and English translation thereof.

International Search Report dated Sep. 5, 2017 by the Japanese Patent Office in counterpart International Application No. PCT/JP2017/023942, and English translation thereof.

Written Opinion of the International Searching Authority dated Sep. 5, 2017 by the Japanese Patent Office in counterpart International Application No. PCT/JP2017/023942, and English translation thereof.

Office Action issued by the Taiwan Intellectual Properly Office dated Nov. 9, 2020 in counterpart Taiwanese Patent Application No. 106122843, and English Translation thereof.

Office Action issued by the Japanese Patent Office and dated Mar. 23, 2021 in counterpart Japanese Patent Application No. 2018-527512, and English Translation thereof.

Notice of Preliminary Rejection issued by Korean Intellectual Property Office in counterpart Korean Patent Application No. 10-2018-7036761, dated Oct. 15, 2021.

Notice of Final Rejection from the Korean Intellectual Property Office, issued in the counterpart Korean Patent Application No. 10-2018-7036761 dated Mar. 17, 2022., and English translation thereof.

Office Action issued by the Taiwanese Intellectual Property Office in counterpart Taiwanese Patent Application No. 110132954, dated Feb. 8, 2022.

Decision of Rejection issued by the Taiwanese Intellectual Property Office and dated Jul. 13, 2022 in counterpart Taiwanese Patent Application No. 110132954, and English Translation thereof.

Reason for Rejection issued by the Korean Intellectual Property Office and dated Jul. 25, 2022 in counterpart Korean Patent Application No. 10-2022-7012597, and English Translation thereof.

Notice of Reason for Refusal from the Japanese Patent Office, issued in the counterpart Japanese Patent Application No. 2022-070731 dated May 9, 2023, and English translation thereof.

Office Action issued by the Taiwan Intellectual Property Office dated Oct. 19, 2023, in counterpart Taiwanese Patent Application No. 110132954, and English Translation thereof.

* cited by examiner

STACKED SUBSTRATE MANUFACTURING METHOD, STACKED SUBSTRATE MANUFACTURING APPARATUS, STACKED SUBSTRATE MANUFACTURING SYSTEM, AND SUBSTRATE PROCESSING APPARATUS

The contents of the following International and Japanese patent application(s) are incorporated herein by reference:
NO. 2016-138029 filed in Japan on Jul. 12, 2016, and
NO. PCT/JP2017/023942 filed on Jun. 29, 2017.

BACKGROUND

1. Technical Field

The present invention relates to a stacked substrate manufacturing method, a stacked substrate manufacturing apparatus, a stacked substrate manufacturing system, and a substrate processing apparatus.

2. Related Art

There is a method for manufacturing a stacked substrate by stacking two substrates (see, for example, Patent document 1).

Patent document 1: Japanese Patent Application Publication No. 2013-098186

Even if the two substrates are aligned before overlaying the two substrates, a misalignment between the substrates sometimes occurs.

SUMMARY

A first aspect of the present invention provides a method of manufacturing a stacked substrate by bonding a first substrate and a second substrate, wherein the stacked substrate manufacturing method includes a step of determining whether or not the first substrate and the second substrate satisfy a predetermined condition based on information about curving of each of the first substrate and the second substrate, and, if the predetermined condition is satisfied, a step of bonding the first substrate and the second substrate.

A second aspect of the present invention provides an apparatus to manufacture a stacked substrate by bonding a first substrate and a second substrate, wherein the stacked substrate manufacturing apparatus includes a bonding unit which bonds the first substrate and the second substrate which are determined to satisfy a predetermined condition based on information about the curving of each of the first substrate and the second substrate.

A third aspect of the present invention provides a stacked substrate manufacturing system including a substrate processing apparatus which processes a first substrate and a second substrate, and a bonding apparatus which bonds the first substrate and the second substrate which have been processed in the substrate processing apparatus, wherein the substrate processing apparatus includes an obtaining unit which obtains information about curving of each of the first substrate and the second substrate, a determining unit which determines whether or not the first substrate and the second substrate satisfy a predetermined condition based on the information, and controlling unit which outputs to the bonding apparatus an indication signal to bond the first substrate and the second substrate if the predetermined condition is satisfied.

The summary clause does not necessarily describe all necessary features of the embodiments of the present invention. The present invention may also be a sub-combination of the features described above.

DESCRIPTION OF EXEMPLARY EMBODIMENTS

In the following, embodiments of the present invention are described. The embodiments do not limit the invention according to the claims. All the combinations of the features described in the embodiments are not necessarily essential to means provided by aspects of the invention.

Figure 1:
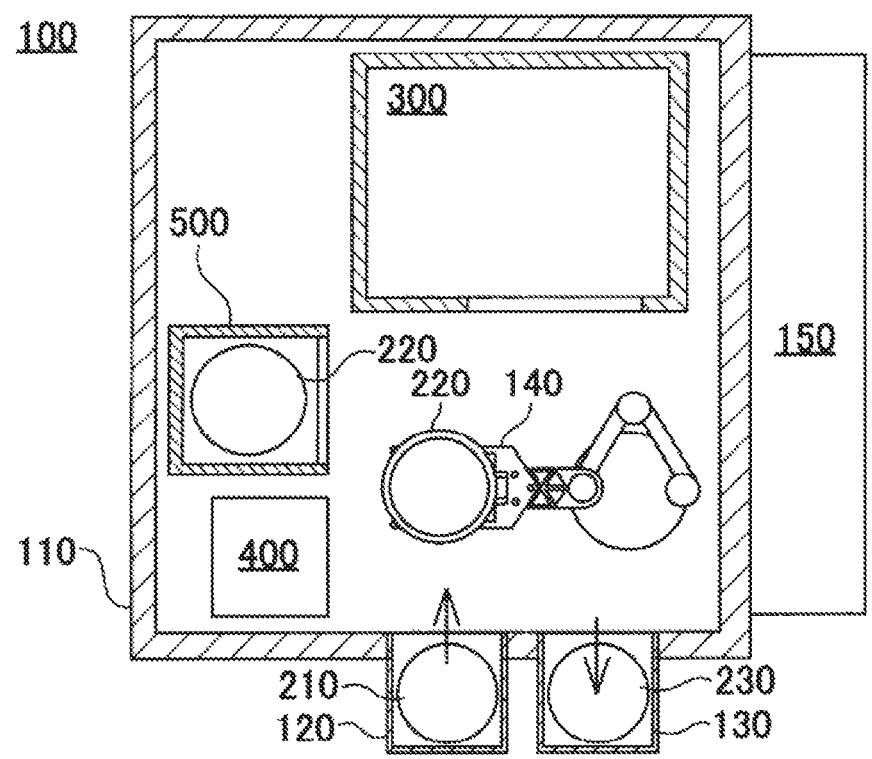
FIG. 1 shows a schematic view of the stacked substrate manufacturing apparatus 100.

FIG. 1 shows a schematic plan view of the stacked substrate manufacturing apparatus 100. The stacked substrate manufacturing apparatus 100 includes a housing 110, a substrate cassette 120 to accommodate substrates 210 to be overlaid, a substrate cassette 130 to accommodate a stacked substrate 230 fabricated by overlaying the substrates 210, a controlling unit 150, a conveying unit 140, a overlaying unit 300, a holder stocker 400 to accommodate a substrate holder 220 to retain the substrates 210, and a prealigner 500. The temperature within the housing 110 is controlled and kept, for example, at room temperature.

The conveying unit 140 carries the single substrate 210, the substrate holder 220, the substrate holder 220 retaining the substrate 210, the stacked substrate 230 fabricated by stacking a plurality of substrates 210, and the like. The controlling unit 150 comprehensively controls each portion of the stacked substrate manufacturing apparatus 100 by making them cooperate with each other. Also, the controlling unit 150 receives a user instruction from the outside and sets a manufacturing condition to manufacture the stacked substrate 230. Further, the controlling unit 150 has a user interface for displaying, to the outside, the operating state of the stacked substrate manufacturing apparatus 100.

The overlaying unit 300 has a pair of opposing stages, each of which retains the substrate 210, and fabricates the stacked substrate 230 by aligning the substrates 210 retained on the stages with each other and then making them contact with each other so that they are overlaid.

The prealigner 500 aligns the substrate 210 and the substrate holder 220 and causes the substrate holder 220 to retain the substrate 210. The substrate holder 220 is made from hard material such as aluminum oxide ceramic, and attracts to and retains the substrate 210 through electrostatic chuck, vacuum chuck, and the like.

In the stacked substrate manufacturing apparatus 100 described above, in addition to the substrate 210 on which elements, circuits, terminals and the like are formed, an untreated silicon wafer, an SiGe substrate to which Ge is added, a monocrystalline Ge substrate, a III-V or II-VI group compound semiconductor wafer and the like, glass substrate, and the like can be joined. The objects to be joined may be a circuit substrate and an untreated substrate, or may be untreated substrates. The substrate 210 to be joined may be itself the stacked substrate 230 having a plurality of substrates which have already been stacked.

Figure 2:
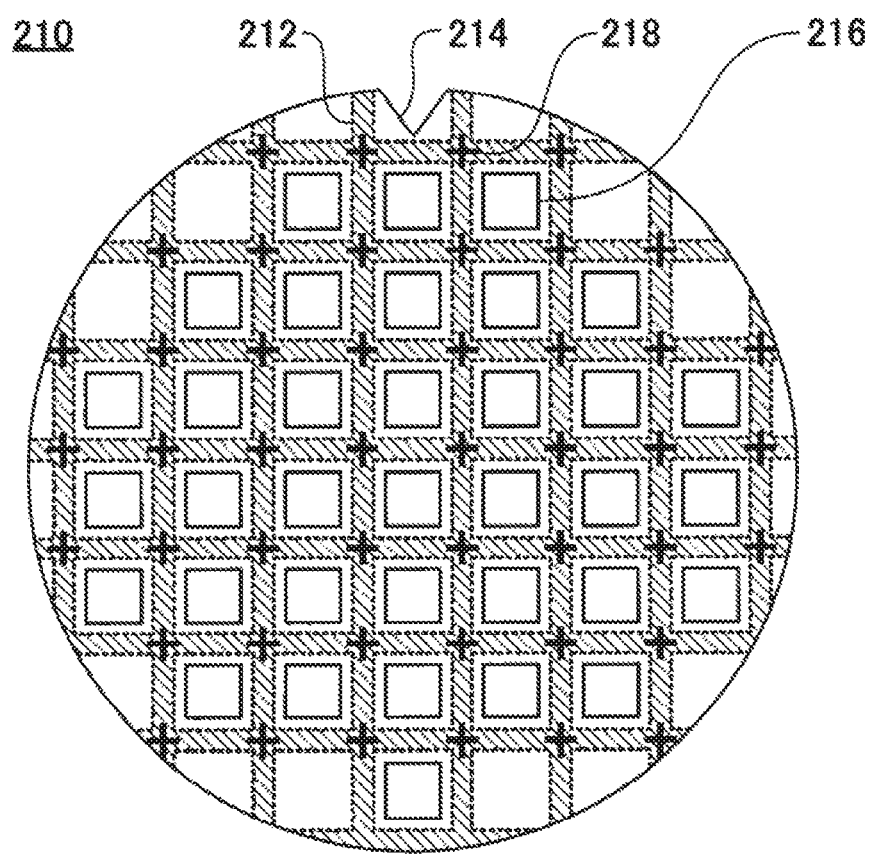
FIG. 2 shows a schematic plan view of the substrate 210.

FIG. 2 shows a schematic plan view of the substrate 210 to be overlaid in the stacked substrate manufacturing apparatus 100. The substrate 210 has a notch 214, a plurality of circuit regions 216, and a plurality of alignment marks 218.

On the front surface of the substrate 210, the circuit regions 216 are placed periodically in the surface direction of the substrate 210. Each of the circuit regions 216 is provided with structural bodies, such as wiring and overcoat, formed by photolithographic technique and the like. On the circuit regions 216, connection portions such as pads and bumps are also placed, which act as connection terminals when the substrate 210 is electrically connected to another substrate 210, a lead frame, and the like. The connection portions are also an example of the structural bodies formed on the front surface of the substrate 210.

The alignment marks 218 are an example of the structural bodies formed on the front surface of the substrate 210, and are placed on scribe lines 212 placed between the circuit regions 216. The alignment marks 218 are the markers for aligning a substrate 210 to another substrate 210.

Figure 3:
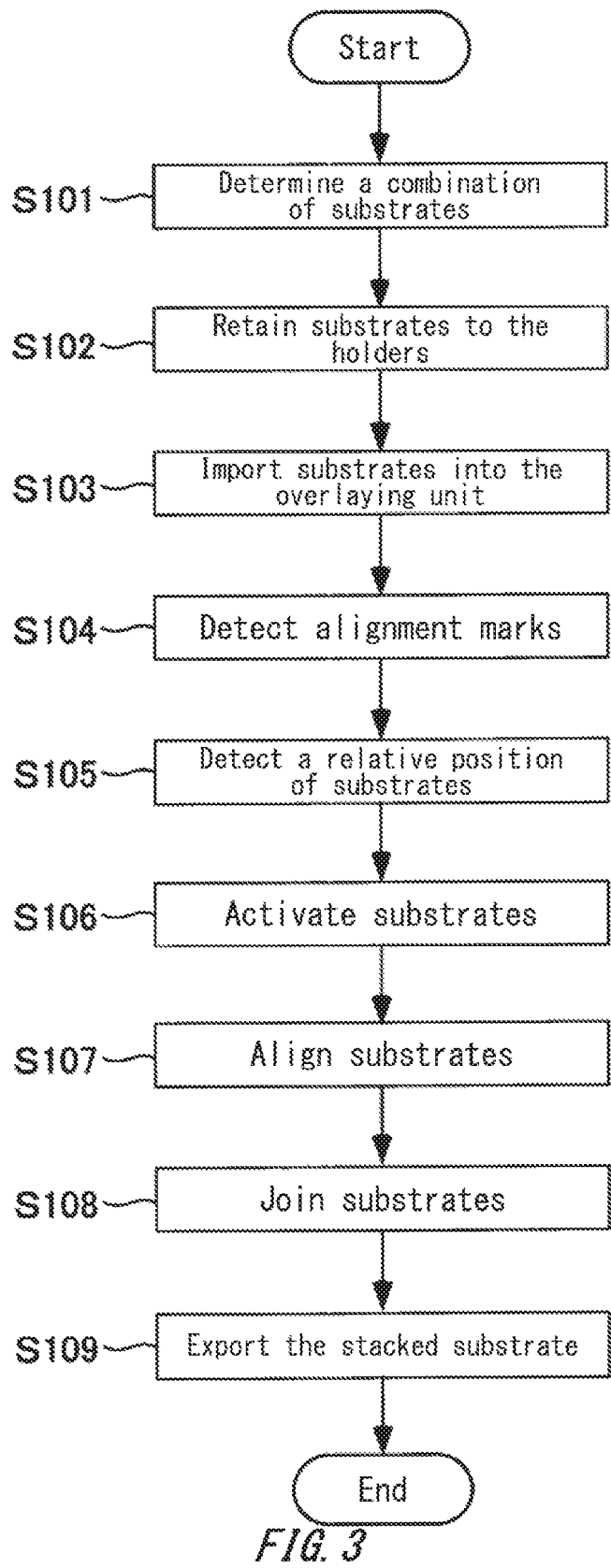
FIG. 3 shows a flow diagram showing a procedure to overlay the substrate 210.

FIG. 3 is a flow diagram showing a procedure to fabricate the stacked substrate 230 by stacking the two substrates 210 in the stacked substrate manufacturing apparatus 100. First, among the plurality of substrates 210, a combination of the substrates 211 and 213, which are to be overlaid and joined with each other, is determined (step S101). There are a plurality of examples for the method of determining the combination of the substrates 211 and 213. These will be described in reference with FIG. 14 and the subsequent figures after describing a procedure to overlay the substrates 210.

Figure 4:
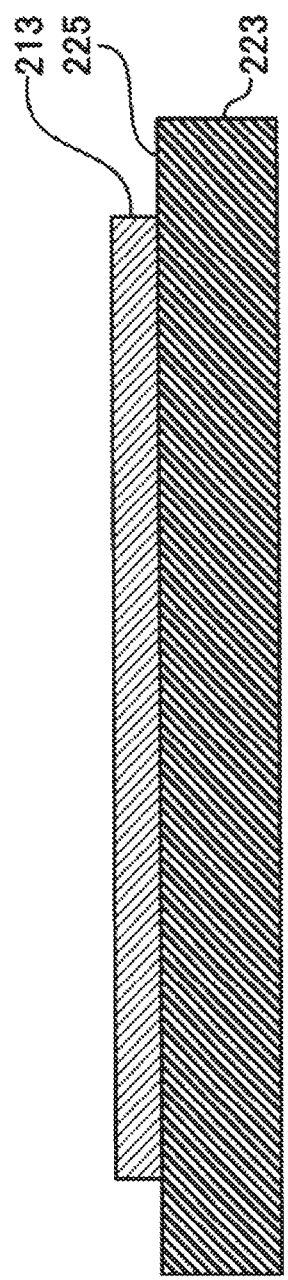
FIG. 4 shows a schematic cross sectional view of the substrate holder 223 retaining the substrate 211.
Figure 5:
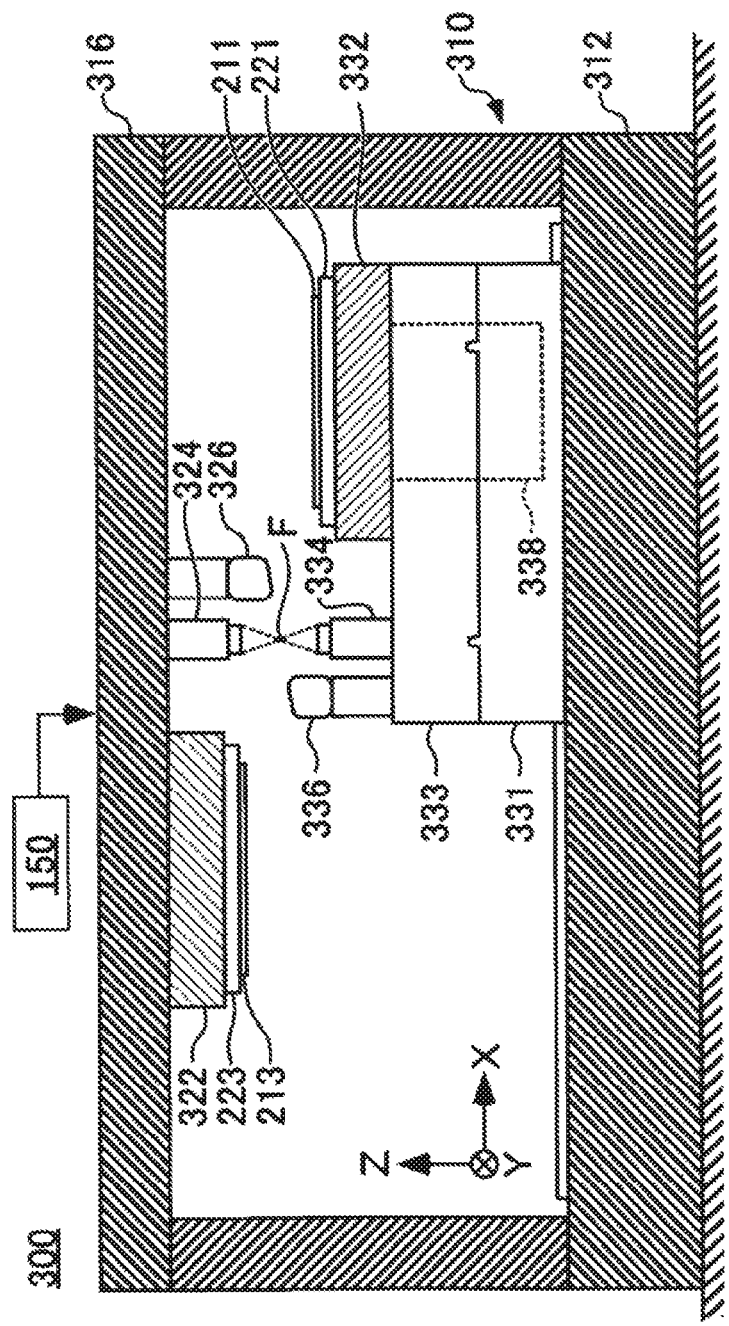
FIG. 5 shows a schematic cross sectional view of the overlaying unit 300.

Then, in the prealigner 500, the substrates 211 and 213 to be overlaid are retained in the substrate holders 221 and 223, respectively (step S102). Then, as shown in FIG. 5, the substrate holders 221 and 223 retaining the substrates 211 and 213 individually are sequentially imported into the overlaying unit 300 (step S103). In the example shown in FIG. 4, the substrate holder 223 has a flat and smooth retaining surface 225.

The overlaying unit 300 includes a frame 310, an upper stage 322, and a lower stage 332. The upper stage 322 is fixed to a ceiling plate 316 of the frame 310 in the downward direction. The upper stage 322 has a retaining feature such as a vacuum chuck and an electrostatic chuck.

It is noted that, in the illustrated state, the substrate 213 retained on the substrate holder 223 having a flat retaining surface 225 is retained on the upper stage 322 located at the upper side in the figure, while the substrate holder 221 having a curved retaining surface 225 is retained on the lower stage 332 located at the lower side in the figure. However, the combinations of the upper stage 322 and the lower stage 332, and the substrate holders 221 and 223 are not limited thereto. Also, the flat substrate holder 223 or the substrate holder 221 with the curved retaining surface may be imported onto both of the upper stage 322 and the lower stage 332.

On the ceiling plate 316, the microscope 324 and the activation apparatus 326 are fixed beside the upper stage 322. The microscope 324 can observe the upper surface of the substrate 211 retained on the lower stage 332. The activation apparatus 326 generates plasma to clean the upper surface of the substrate 211 retained on the lower stage 332.

The lower stage 332 is mounted onto the upper surface, in the figure, of the Y-direction driving unit 333 stacked on the X-direction driving unit 331 placed on the base plate 312 of the frame 310. The X-direction driving unit 331 moves in the direction indicated with the arrow X in the figure, in parallel with the base plate 312. The Y-direction driving unit 333 moves on the X-direction driving unit 331 in the direction indicated with the arrow Y in the figure, in parallel with the base plate 312. The lower stage 332 moves in two dimensions in parallel to base plate 312 by combining the operation of the X-direction driving unit 331 and the Y-direction driving unit 333.

Also, the lower stage 332 is supported by the lift driving unit 338 which moves up and down in the direction indicated with the arrow Z, which is vertical to the base plate 312. Thus, the lower stage 332 can move up and down relative to the Y-direction driving unit 333.

The moving amounts of the lower stage 332 moved by the X-direction driving unit 331, the Y-direction driving unit 333 and the lift driving unit 338 are precisely measured by using an interferometer and the like.

On the Y-direction driving unit 333, the microscope 334 and the activation apparatus 336 are each mounted beside the lower stage 332. The microscope 334 can observe the lower surface of the substrate 213 retained on the upper stage 322 in the downward direction. The activation apparatuses 336 generate plasma to clean the lower surface of the substrate 213 retained on the upper stage 322. It is noted that these activation apparatus 326 and 336 may be provided on the apparatus other than the overlaying unit 300 and a robot may carry the substrate with the activated upper surface and the substrate holder into the overlaying unit 300 from the activation apparatus 326 and 336.

It is noted that the overlaying unit 300 may further include a rotation driving unit to rotate the lower stage 332 around the axis of rotation which is vertical to the base plate 312, and an swing driving unit to swing the lower stage 332. Thus, the alignment precision of the substrates 211 and 213 can be improved by rotating the substrate 211 retained on the lower stage 332 as well as making the lower stage 332 in parallel with the upper stage 322.

The controlling unit 150 calibrates the microscope 324 and 334 by causing them to observe the same markers or adjusting the focal points with each other. Thus, the relative positions of a pair of the microscope 324 and 334 in the overlaying unit 300 are measured.

Figure 6:
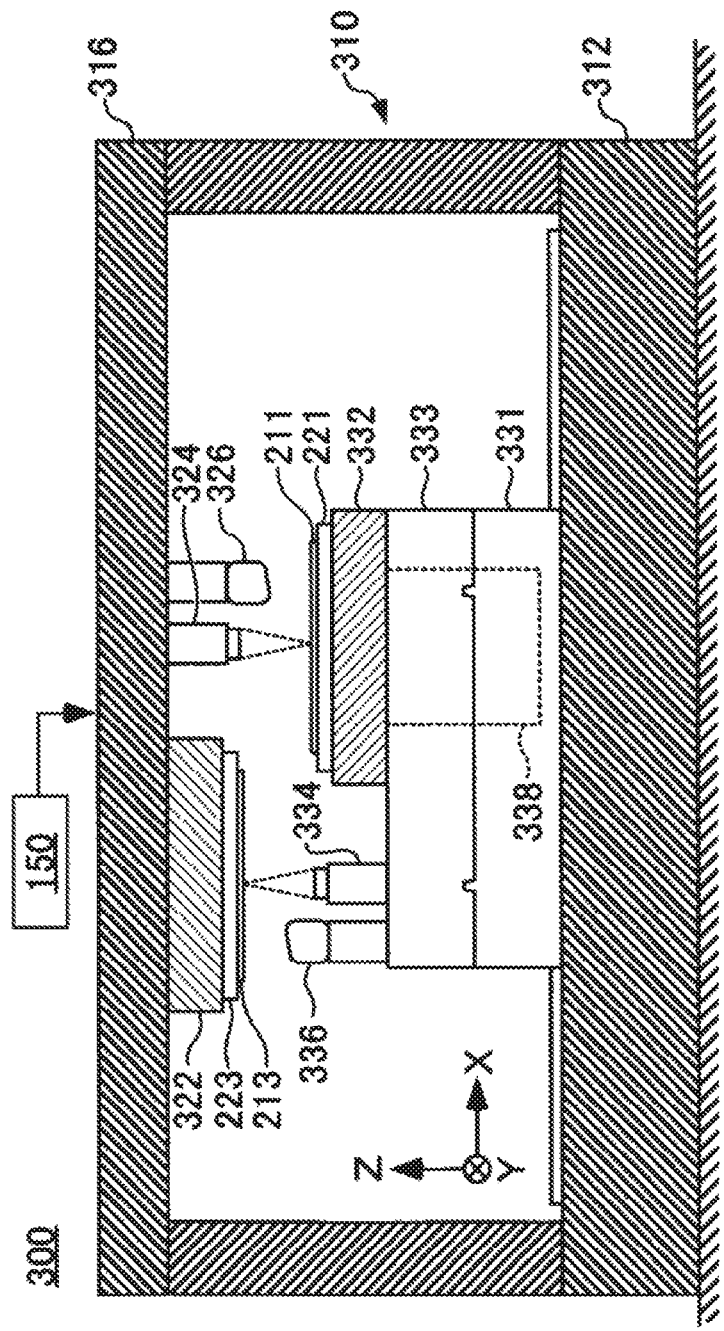
FIG. 6 shows a schematic cross sectional view of the overlaying unit 300.

Following the state shown in FIG. 5, as shown in FIG. 6 (step S104 in FIG. 3), the controlling unit 150 operates the X-direction driving unit 331 and the Y-direction driving unit 333 to enable the microscope 324 and 334 to detect the alignment marks 218 which are provided on each of the substrates 211 and 213.

Thus, the relative positions of the substrates 211 and 213 can be learned by detecting the positions of the alignment marks 218 of the substrates 211 and 213 using the microscopes 324 and 334 whose relative positions are known (step S105). Therefore, when the substrates 211 and 213 are aligned, the relative moving amounts of the substrates 211 and 213 may be calculated such that the misalignment between the corresponding alignment marks 218 of the substrates 211 and 213 is equal to or less than a threshold, or the misalignment between the corresponding circuit regions 216 or the connection portions of the substrates 211 and 213 is equal to or less than a threshold. The misalignment refers to the misalignment between the corresponding alignment marks 218 of the stacked substrates 211 and 213, and to the misalignment between the corresponding connection portions, and includes the misalignment due to the difference in amount of distortion which occurs in each of the two substrates 211 and 213. The distortion will be described below.

Figure 7:
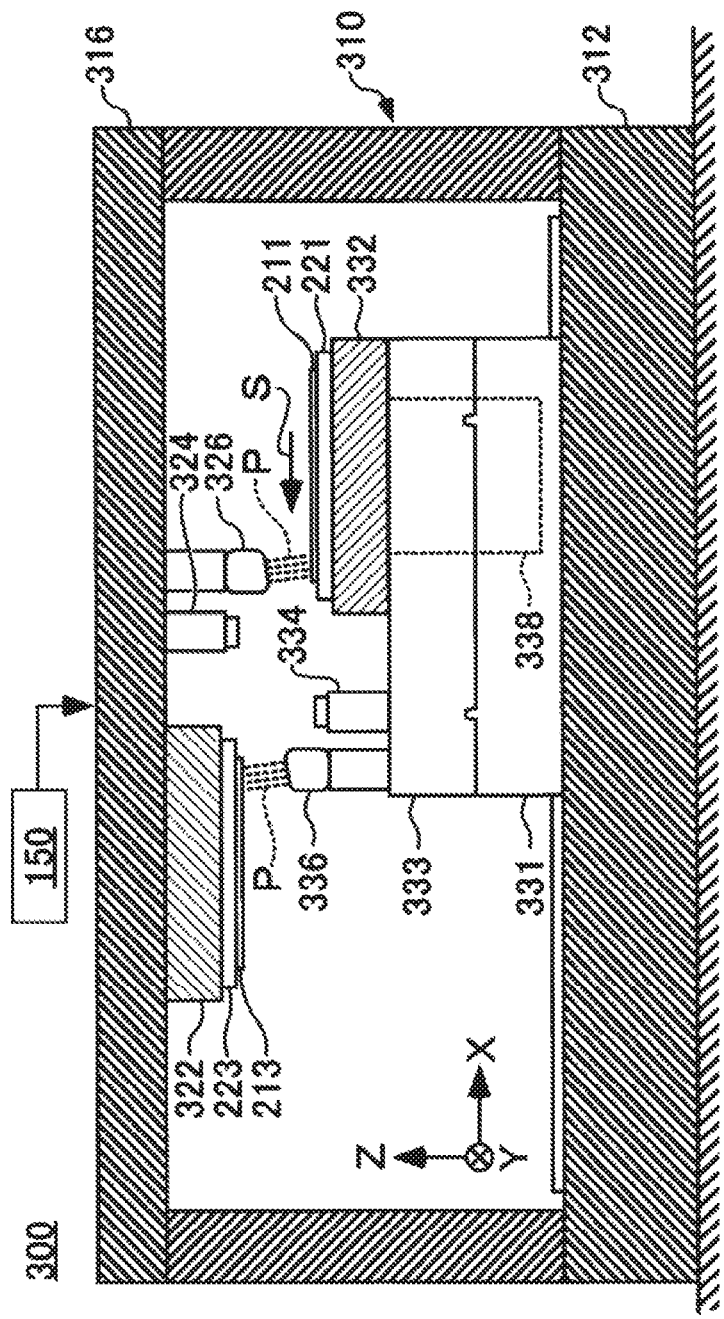
FIG. 7 shows a schematic cross sectional view of the overlaying unit 300.

Following the state shown in FIG. 6, the controlling unit 150 records the relative positions of a pair of the substrates 211 and 213 and chemically activates the joined surface of each of the pair of the substrates 211 and 213, as shown in FIG. 7 (step S106 in FIG. 3). The controlling unit 150 first resets the position of the lower stage 332 to the initial position, and then move it horizontally to scan the front surface of the substrates 211 and 213 using plasma generated by the activation apparatus 326 and 336. Thus, each front surface of the substrates 211 and 213 are cleaned, and the chemical activity is increased.

In addition to the plasma exposure method, the front surfaces of the substrates 211 and 213 can also be activated by sputter etching using inert gas, ion beam, high speed atom beam, or the like. When ion beam or high speed atom beam is used, the overlaying unit 300 can be generated under a reduced pressure. Still further, the substrates 211 and 213 can also be activated by ultraviolet radiation, ozone asher, and the like. Further, for example, they can also be activated by chemically cleaning the front surface of the substrates 211 and 213 using liquid or gas etchant. Also, the front surface of the substrates 211 and 213 can be hydrophilized using a hydrophilizing apparatus after the front surface of the substrate 210 is activated.

Figure 8:
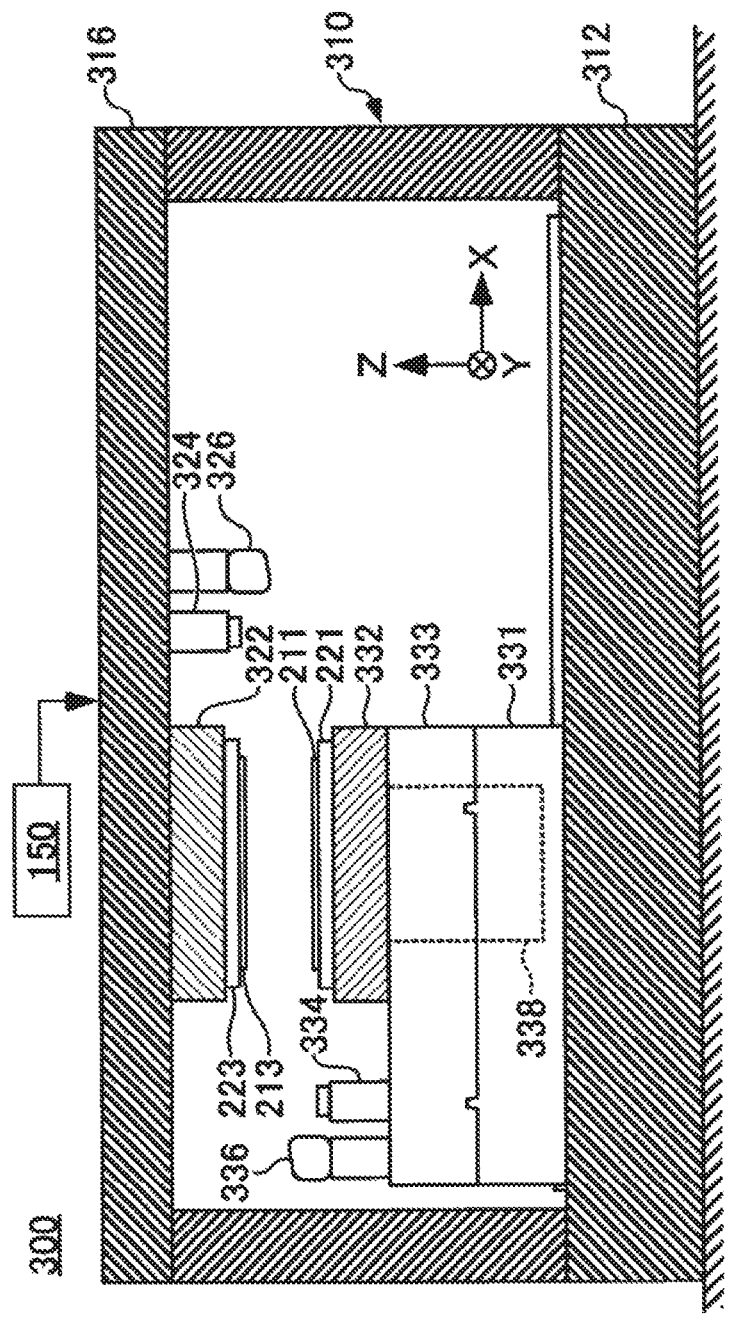
FIG. 8 show a schematic cross sectional view of the overlaying unit 300.

Following the state shown in FIG. 7, the controlling unit 150 aligns the substrates 211 and 213 with each other, as shown in FIG. 8 (step S107 in FIG. 3). Based on the relative positions of the microscope 324 and 334 which are initially detected and the positions of the alignment marks 218 of the substrates 211 and 213 which are detected in step S104, the controlling unit 150 first moves the lower stage 332 in such a manner that the positions of the circuit regions 216, which are corresponding to each other, in the substrates 211 and 213 are aligned.

Figure 9:
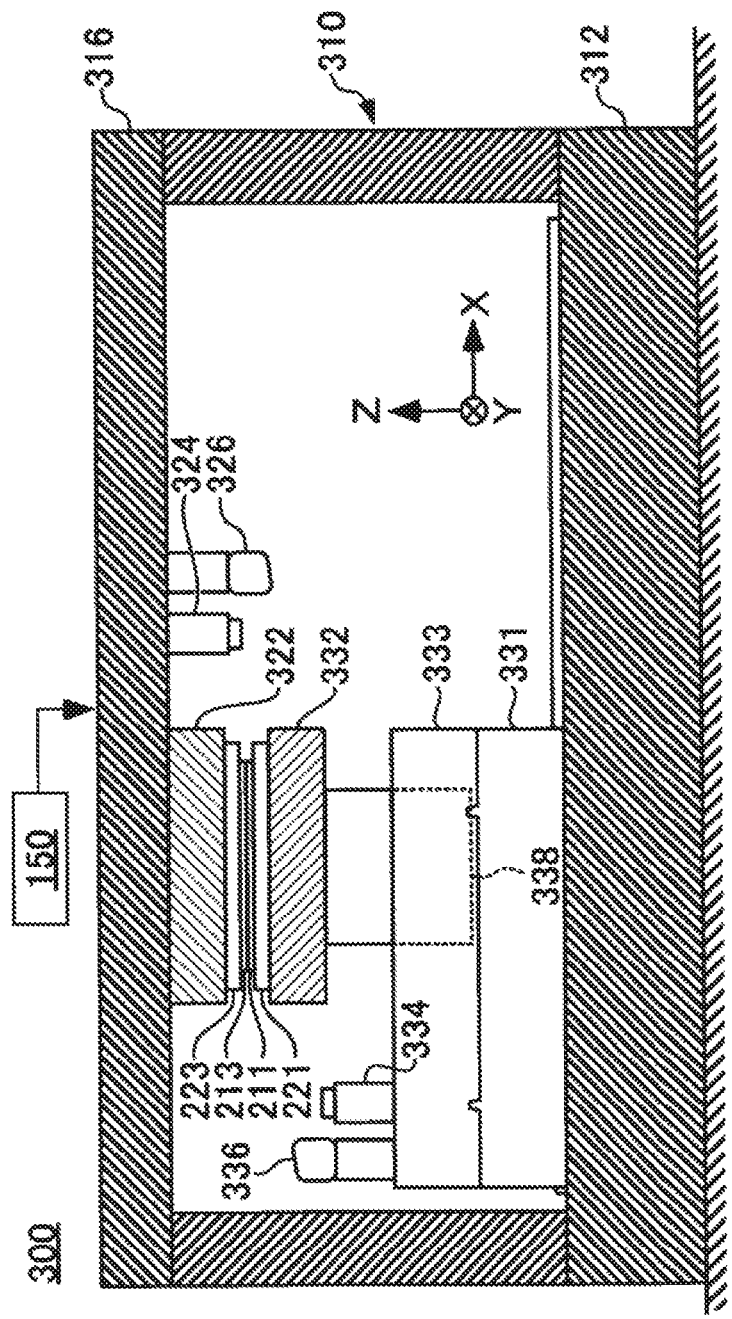
FIG. 9 shows a schematic cross sectional view of the overlaying unit 300.

Following the state shown in FIG. 8, as shown in FIG. 9, the controlling unit 150 operates the lift driving unit 338 to raise the lower stage 332, and makes the substrates 211 and 213 contact with each other. Thus, portions of the substrates 211 and 213 contact with each other and are joined (step S108).

Because the front surfaces of the substrates 211 and 213 are activated, the adjacent regions are autonomously attracted and joined with each other due to the intermolecular force between the substrates 211 and 213 once the portions of them contact with each other. Therefore, the region where the substrates 211 and 213 are joined are sequentially spread from the contacting portion to the adjacent region, for example, by releasing the substrate 213 retained on the substrate holder 223, which is retained on the upper stage 322. Thus, a bonding wave is generated in which the contacting regions sequentially spread, and the joining of the substrates 211 and 213 proceeds. The substrates 211 and 213 finally contact with each other and are joined across the entire surface (step S108). Thus, the substrates 211 and 213 form the stacked substrate 230.

It is noted that, during the above-described process in which the contact regions of the substrates 211 and 213 spread, the controlling unit 150 may release the substrate 213 retained by the substrate holder 223. The controlling unit 150 may alternatively release the substrate holder 223 retained by the upper stage 322.

Further, the controlling unit 150 may facilitate the joining of the substrates 211 and 213 by releasing the substrate 211 on the lower stage 332 without releasing the substrate 213 on the upper stage 322, or may release both of the two substrates 211 and 213. Further, the controlling unit 150 may join the substrates 211 and 213 by bringing the upper stage 322 and the lower stage 332 further closer with both the substrates 213 and 211 retained on the upper stage 322 and the lower stage 332.

The stacked substrate 230 fabricated in this way is exported from the overlaying unit 300 along with the substrate holder 221 by the conveying unit 140 (step S109). Then, the stacked substrate 230 and the substrate holder 221 are separated at the prealigner 500, and the stacked substrate 230 is carried to the substrate cassette 130.

If the amounts of distortions occurring in the two substrates 210 are different from each other, the relative moving amount and the relative rotating amount in which the amount of misalignment between the substrates 211 and 213 is equal to or less than the threshold cannot be calculated even when the overlaying unit 300 aligns them in the surface direction of the substrate 210 based on the alignment mark 218 and the like. Therefore, it is possible that the misalignment between the substrates 211 and 213 cannot be eliminated. Thus, in step S101 shown in FIG. 3, the combination of the substrates 211 and 213 to be overlaid is determined in such a manner that misalignment due to the difference in final magnification ratio caused by bonding of the substrates 211 and 213 with each other is equal to or less than the threshold.

Here, the distortion occurring in the substrate 211 (213) is the displacement of a structural body on the substrate 211 (213) from the design coordinate, i.e. the design position. The distortion occurring in the substrate 211 (213) includes two-dimension distortion and three-dimension distortion.

The two-dimension distortion is a distortion occurring in the direction along the joined surface of the substrates 211 and 213, and includes linear distortion, in which the displaced positions relative to the design positions of the structural bodies in each of the substrates 211 and 213 are represented by linear transformation, and nonlinear distortion, which cannot be represented by linear transformation and is not the linear distortion.

The linear distortion includes a magnification ratio in which displacement amount increases from the center along the radial direction, at a constant increase rate. The magnification ratio is a value which is obtained by dividing the amount of deviation from a designed value at a distance of X from the center of the substrates 211 and 213, by X, and whose unit is ppm. The magnification ratio includes isotropic magnification ratio, in which the displacement vector from the design position has the X component and Y component of the same amount, and the anisotropic magnification ratio, in which the displacement vector from the design position has components of different amounts.

In this implementation, the design positions of the structural bodies in the two substrates 211 and 213 to be bonded are the same, and the difference in magnification ratio relative to the design positions of the two substrates 211 and 213 is the amount of misalignment between the two substrates 211 and 213.

Also, the linear distortion includes orthogonal distortion. The orthogonal distortion is, assuming an X-axis and a Y-axis orthogonal to each other and an origin at the center of the substrate, a distortion of displacement of the structural body in the direction parallel to the X-axis from the design position, and the amount of the distortion increases as the structural body is farther from the origin in the direction of the Y-axis. The displacement amount is the same in each of a plurality of regions which cross the Y-axis in the direction parallel to the X-axis and the absolute value of the displacement amount increases as it is farther from the X-axis. Furthermore, in the orthogonal distortion, the direction of the displacement at the positive side of the Y-axis and the direction of the displacement at the negative side of the Y-axis are opposite with each other.

The three-dimension distortion of the substrates 211 and 213 is the displacement in the direction other than the direction which is along the joined surface of the substrates 211 and 213, i.e. in the direction intersecting the joined surface. The three-dimension distortion includes curving which occurs entirely or partly on the substrates 211 and 213 due to entire or partial bending of the substrates 211 and 213. Here, "bending of the substrate" means that the substrates 211 and 213 change their shape in such a manner that the resulting front surfaces of the substrates 211 and 213 includes points which do not exist in the plane determined by three points on the original substrates 211 and 213.

Also, the curving is a distortion in which the front surface of the substrate forms curved surface, and includes, for example, a warpage and a deflection of the substrates 211 and 213. In this implementation, the warpage refers to the distortion remained in the substrates 211 and 213 in the state in which the effect of the gravity is eliminated. The deflection is distortion of the substrates 211 and 213 obtained by adding the effect of the gravity to the warpage. It is noted that the warpage of the substrates 211 and 213 includes a global warpage, in which the substrates 211 and 213 entirely bend at a generally uniform curvature, and a local warpage, in which a portion of the substrates 211 and 213 shows a local changes in curvature.

Here, the magnification ratio is classified into an initial magnification ratio, a flattening magnification ratio, and a joining process magnification ratio, depending on the cause of occurrence.

The initial magnification ratio occurs as a deviation from the design specification of the substrates 211 and 213 before overlaying the substrates 211 and 213, resulting from the stress occurring in the process of fabricating the alignment marks 218 and the circuit regions 216 and the like on the substrates 211 and 213, the anisotropy due to the crystalline orientation of the substrates 211 and 213, the periodic change in the stiffness due to the arrangement of the scribe lines 212, the circuit region 216 and the like, and the like. Therefore, the initial magnification ratio of the substrates 211 and 213 can be known before starting the stacking of the substrates 211 and 213. For example, the controlling unit 150 may obtain information about the initial magnification ratio from the processing equipment which has manufactured the substrates 211 and 213.

The flattening magnification ratio corresponds to the change in the magnification ratio occurring when the substrates 211 and 213 in which distortion such as warpage has occurred are flattened through joining or attracting to a flat retaining member. The substrate 210 in which a warpage has occurred becomes flat along the shape of the retaining surface 225 when the substrate 210 is attracted to and retained on the flat substrate holder 223 shown, for example, in FIG. 4. Here, when the substrate 210 changes from the warped state to the flat state, the distortion amount in the substrate 210 changes in comparison to that before the retention.

Thus, the amount of misalignment of the circuit regions 216 on the front surface of the substrate 210 relative to the design specification changes in comparison to that before retention. The change in the distortion amount of the substrate 210 varies depending on the structure of the structural bodies, such as the circuit regions 216, fabricated on the substrate 210, the process to fabricate the structural bodies, the magnitude of the warpage of the substrate 210 before the retention, and the like. As in the case of the joining process magnification ratio, if distortions such as a warpage occurred in the substrates 211 and 213, the magnitude of the flattening magnification ratio can be calculated from the distortion state including the warpage amount, the warpage shape and the like of the substrates 211 and 213 by checking the correlation between the distortion and the magnification ratio in advance.

Figure 10:
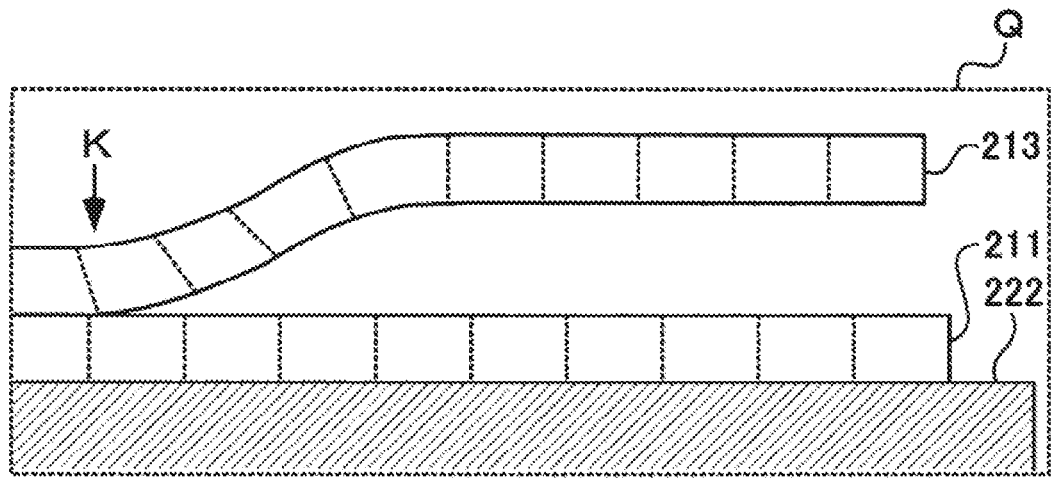
FIG. 10 shows a partially enlarged view showing an overlaying process of the substrates 211 and 213.
Figure 11:
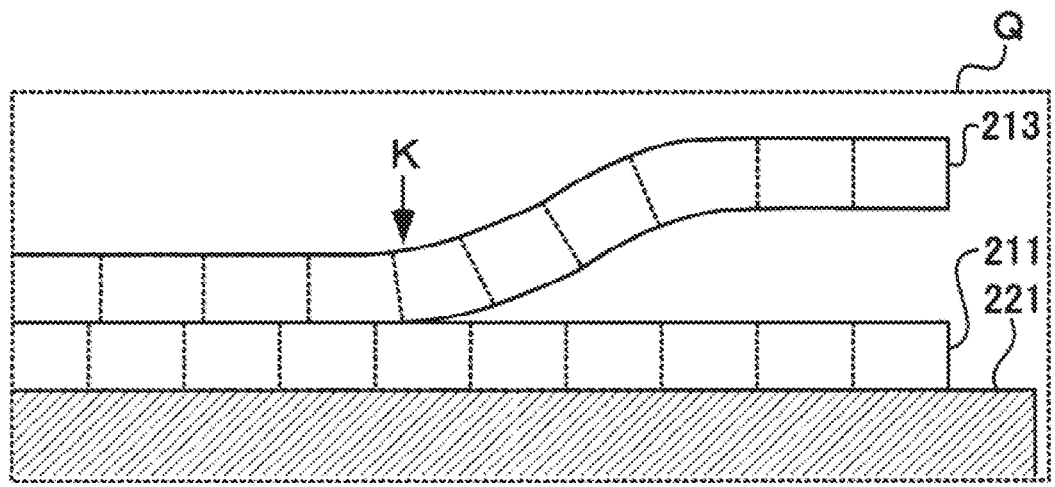
FIG. 11 shows a partially enlarged view showing an overlaying process of the substrates 211 and 213.
Figure 12:
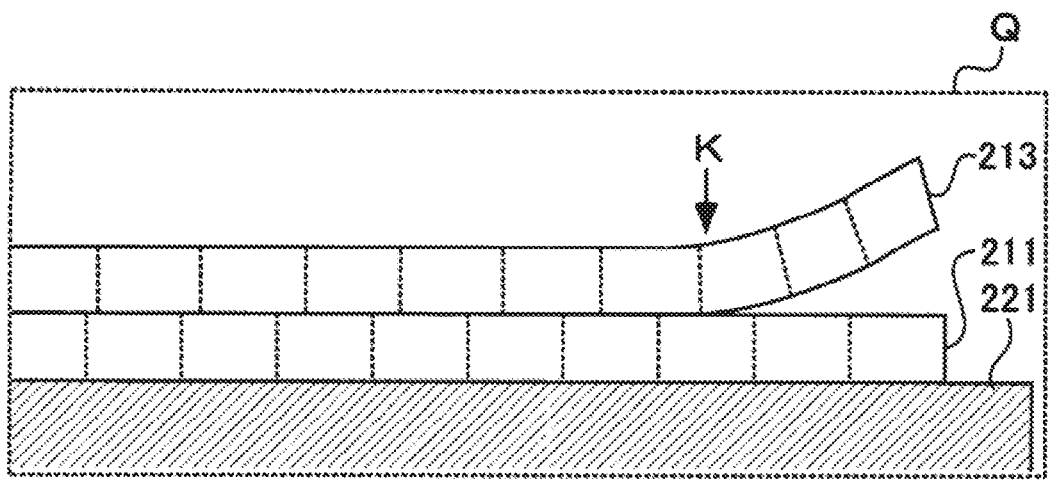
FIG. 12 shows a partially enlarged view showing an overlaying process of the substrates 211 and 213.

The joining process magnification ratio is a newly occurring change in the magnification ratio due to the distortion which occurs in the substrates 211 and 213 in the process of joining. FIG. 10, FIG. 11, FIG. 12, and FIG. 13 describe the joining process magnification ratio. FIGS. 10, 11, and 12 show an enlarged region Q near the boundary K between the contact region, where the substrates 211 and 213 contact with each other, and the non-contact region, where the substrates 211 and 213 do not contact with and are apart from each other and are to be overlaid, in the substrates 211 and 213 in the process of joining in the overlaying unit 300.

As shown in FIG. 10, as the area of the contact region in which the substrates 211 and 213 are overlaid expands from the center towards the perimeter, the boundary K moves from the center side of the substrates 211 and 213 toward the perimeter side. In the vicinity of the boundary K, an expansion occurs in the substrate 213 which is released from retention by the substrate holder 223. Specifically, on the boundary K, the substrate 213 expands on the lower surface side of the substrate 213 in the figure, while the substrate 213 contracts on the upper surface side in the figure, relative to the center plane of the substrate 213 in the thickness direction.

Thus, as shown with the dotted lines in the figure, in the substrate 213, a distortion occurs at the outer edge of the region joined to the substrate 211, as though the magnification ratio on the front surface of the substrate 213 relative to the design specification of the circuit regions 216 enlarges relative to the substrate 211. Therefore, as shown as a deviation of the dotted lines in the figure, a misalignment occurs between the lower substrate 211 retained on the substrate holder 222 and the upper substrate 213 released from the substrate holder 223, due to the expanding amount of the substrate 213, i.e. difference in magnification ratio.

Further, as shown in FIG. 11, when the substrates 211 and 213 contact and are joined with each other in the above-described state, the enlarged magnification ratio of the substrate 213 is fixed. Further, as shown in FIG. 12, the expansion amount of the substrate 213 fixed by joining is accumulated as the boundary K moves toward the perimeter of the substrates 211 and 213.

The amount of the joining process magnification ratio as described above can be calculated based on physical quantities such as the stiffness of the substrates 211 and 213 to be overlaid and the viscosity of atmosphere caught between the substrates 211 and 213. Also, the deviation amount generated after the overlaying of the substrates manufactured in the same lot as the substrates 211 and 213 to be overlaid may be measured and recorded in advance and the controlling unit 150 may obtain the recorded measurement value as the information about the joining process magnification ratio occurring by the joining of the substrates 211 and 213 in the lot.

Figure 13:
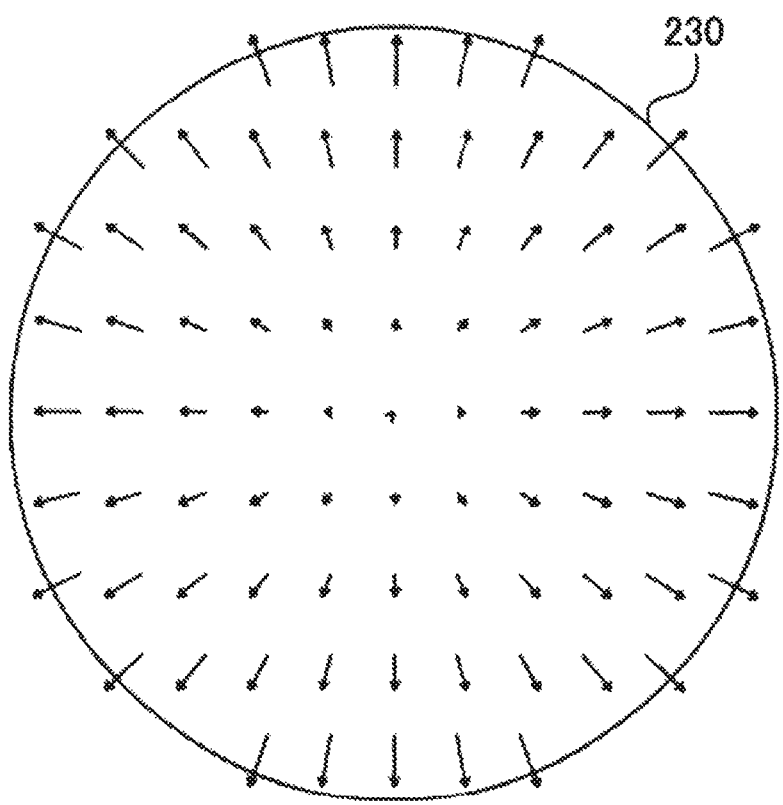
FIG. 13 shows a schematic view showing deviation amounts at various portions in the substrate 211.

FIG. 13 shows the distribution of misalignments due to the magnification ratio difference between the two substrates 211 and 213 which constitute the stacked substrate 230. The illustrated deviations have deviation amounts which gradually increase radially from the center point of the stacked substrate 230 in the surface direction. It is noted that the illustrated magnification ratio includes the initial magnification ratio and the flattening magnification ratio which occurred before the overlay of the substrates 211 and 213, and the joining process magnification ratio which occurs in the process of overlaying the substrates 211 and 213.

It is noted that when the substrates 211 and 213 are joined, while one substrate, for example substrate 211, is retained, the other substrate 213 is released. Therefore, at a point of time at which the substrates 211 and 213 are joined, the released substrate 213 is distorted as it is joined, while the shape of the retained substrate 211 is fixed. Therefore, the joining process magnification ratio does not have to be considered for the substrate 211 which is fixed as it is joined, while the joining process magnification ratio is preferably considered for the substrate 213 to be released.

When the fixed substrate 211 is retained in a distorted state due to the shape of the substrate holder 221 and the like, both of the joining process magnification ratio and the flattening magnification ratio are preferably considered for the released substrate 213. Further, when the substrate 213 has a distortion such as warpage, the joining process magnification ratio and the flattening magnification ratio to which this distortion is added are preferably considered.

In this way, the final magnification ratio difference after the overlaying of the substrates 211 and 213 is formed by adding the difference in flattening magnification ratio occurring when the substrates 211 and 213 are retained on the substrate holders 221 and 223 and the like, and the joining process magnification ratio of the substrate 213 released from retention in the process of joining, to the difference in initial magnification ratio which the substrates 211 and 213 initially have.

As described above, the misalignment in the stacked substrate 230 fabricated by stacking the substrates 211 and 213 is correlated with the initial magnification ratio difference, the flattening magnification ratio difference, and the magnitude of the joining process magnification ratio. Also, the magnification ratio occurring in the substrates 211 and 213 is correlated with the distortion such as warpage in the substrate.

Further, these initial magnification ratio difference, flattening magnification ratio difference, and joining process magnification ratio can be estimated by a measurement, calculation, and the like before joining as described above. Therefore, by determining, before joining, a combination of substrates 211 and 213 to be joined based on the estimated magnification ratios for the substrates 211 and 213 and dealing with it, an excessive misalignment can be suppressed in the stacked substrate 230 manufactured by bonding.

Figure 14:
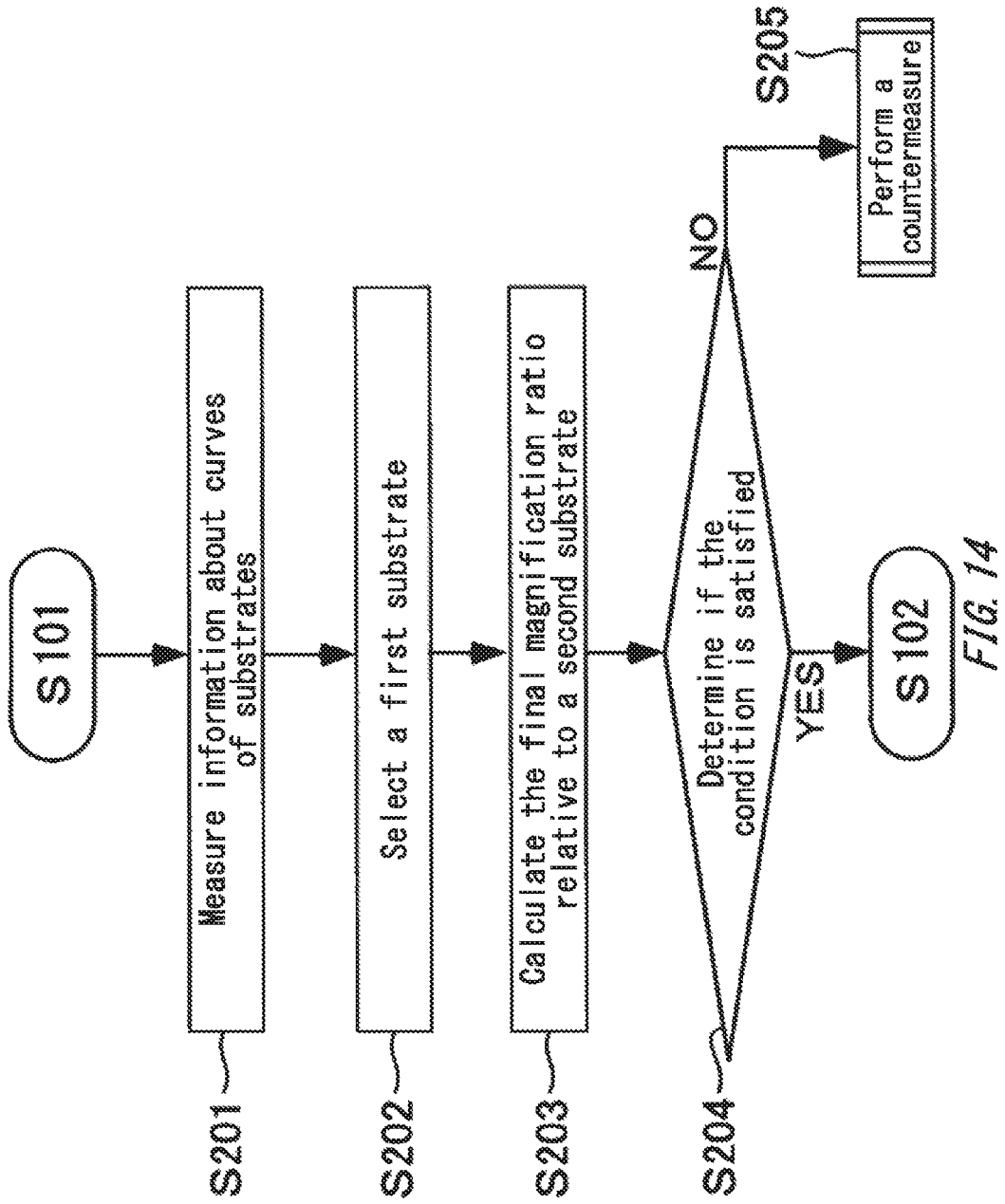
FIG. 14 shows a flow diagram showing a procedure to determine a combination of the substrate 210.

FIG. 14 shows contents of procedure to determine a combination of substrates 211 and 213 to be overlaid in the step S101 shown in FIG. 3.

When a combination of the substrates 211 and 213 to be overlaid is determined, the controlling unit 150 in the stacked substrate manufacturing apparatus 100 first collects information about curving in each of the substrates 211 and 213, for a group of substrates 211 and 213 such as a plurality of substrates 210 belonging to one substrate cassette 120 or the same lot (step S201).

The controlling unit 150 forms an obtaining unit to obtain information about curving including the warpage of the substrates 211 and 213 to be overlaid.

The information about the curving of the substrates 211 and 213 includes information which can be obtained by measuring the substrate 210, such as the magnitude and direction of a warpage, a portion of warpage, the internal stress and, and the like of the substrates 211 and 213, information about a cause generating warpages in the substrates 211 and 213, and information such as the magnitude and direction of the warpage in the substrates 211 and 213, which are estimated from the cause.

When measuring warpages in the substrates 211 and 213, the front surface or back surface of the substrates 211 and 213 is observed with a non-contact distance sensor such as a microscope provided on, for example, the overlaying unit 300 while the substrates 211 and 213 are supported at the center in the surface direction and are rotated around the center, and the position of the front surface or the back surface is measured based on the distribution of the distance information obtained with an automatic focusing feature included in the optics in the microscope.

Thus, the magnitude, direction, and the like of the deflection on the substrates 211 and 213 can be measured. The magnitude and direction of deflections in the substrates 211 and 213 are obtained from displacements at a plurality of positions in the front surface or back surface in the thickness direction of the substrates 211 and 213 relative to the supported center as a reference. In this implementation, the average value of the displacements in a plurality of positions in each of the substrates 211 and 213 is the magnitude of the global warpage. The difference between the deflection and the warpage in the substrates 211 and 213 can be known based on the results of measuring the substrates 211 and 213 without warpage in the same condition. Therefore, the warpage amount of the substrates 211 and 213 can be calculated by measuring the deflection of the substrates 211 and 213 in which the warpages occur and subtracting the difference.

Further, the residual stress of the substrates 211 and 213 which is measured with Raman scattering and the like in a state that the substrates 211 and 213 is forcibly flattened by attracting them to the substrate holder 221 and the like, and this residual stress may be regarded as the information about the warpage of the substrate. Further, the information about the warpages of the substrates 211 and 213 may be measured in a preprocessing apparatus such as an exposure apparatus and a film deposition apparatus which are used in the process which is done before the stacked substrate manufacturing apparatus 100. Also, the measurement of the warpages of the substrates 211 and 213 may be done before importing the substrates 211 and 213 into the overlaying unit 300. For example, in the stacked substrate manufacturing apparatus 100, the prealigner 500 may be provided with a measuring apparatus to measure the warpages of the substrates 211 and 213.

On the other hand, if the information about the warpages of the substrates 211 and 213 is analytically obtained without measuring the warpages of the substrates 211 and 213, the magnitude, direction, and the like of the warpages occurring in the substrates 211 and 213 may be estimated based on the information about the structure and material of the structural bodies such as the circuit regions 216 fabricated on the substrates 211 and 213. Also, the warpage occurring in the substrates 211 and 213 may be estimated based on information on the cause of the warpage, such as information about the treatment process to the substrates 211 and 213 occurring in the process of fabricating the above-described structural body i.e. the thermal history involved in film deposition and the like, and a chemical process such as etching.

Also, when warpages occurring on the substrates 211 and 213 are estimated, peripheral information such as the front surface structure of the substrates 211 and 213, a membrane thickness of the film stacked on the substrate 210, and a tendency, variation, film deposition procedure, condition of the film deposition apparatus such as a CVD apparatus used for film deposition, which may cause the warpages occurring in the substrates 211 and 213, may be referred as well. These pieces of peripheral information may be measured again in order to estimate the warpages.

Further, in order to estimate the warpages of the substrates 211 and 213 as described above, the previous data and the like may be referred when the equivalent substrates were treated, or data of the relationship between the warpage amount and the magnification ratio, the relationship between the difference in warpage amount and the magnification ratio difference, or the combination of the warpage amounts in which the difference in magnification ratio i.e. the amount of misalignment is equal to or less than the threshold may be prepared in advance by experimenting the process assumed for the substrate equivalent to the substrates 211 and 213 to be overlaid. Further, the data may be prepared by analytically obtaining the warpage amount with finite element technique and the like based on the film deposition structure and the film deposition condition of the substrates 211 and 213 to be overlaid.

It is noted that the measurement of the distortion amounts in the substrates 211 and 213 may be performed outside the stacked substrate manufacturing apparatus 100, or an apparatus to measure the distortion in the substrates 211 and 213 may be incorporated within the stacked substrate manufacturing apparatus 100 or a system including the stacked substrate manufacturing apparatus 100. Further, measurement items can be increased in conjunction with internal and external measuring apparatus.

Then, the controlling unit 150 selects any one of first substrate 213 from a plurality of substrates 210 from which information about the curving was obtained in the step S201 (step S202) and calculates each magnification ratio which is finally remained when the selected first substrate 213 and the tentatively combined second substrate 211 are overlaid (step S203). In the subsequent description, the finally remained magnification ratio in the two substrates 211 and 213 is referred to as the final magnification ratio. Further, the controlling unit 150 determines whether or not the tentative combination of the first substrate 213 and the second substrate 211 described above satisfies the condition predetermined for the stacked substrate 230 by comparing the difference in calculated final magnification ratio to the predetermined threshold (step S204).

It is noted that, in this implementation, the predetermined condition is, for example, a threshold corresponding to the maximum deviation amount which allows electrical conduction between the substrates 211 and 213 after the substrates 211 and 213 are bonded to each other, and if each of the substrates 211 and 213 is provided with structural bodies such as connection portions, the predetermined condition is a value corresponding to the amount of misalignment between the substrates 211 and 213 which occurs when the structural bodies at least partially contact with each other. The threshold is, for example, equal to or less than 1.0 µm, and more preferably, equal to or less than 0.5 µm. If the amount of misalignment is larger than the threshold, the connection portions do not contact with each other or appropriate electrical conduction cannot be obtained, or the predetermined joining strength cannot be obtained between the joining portions. The threshold can be set depending on the amount of the correction done by the correcting unit such as the substrate holder and the correction mechanism for distortion correction described below.

If the controlling unit 150 determines that the tentative combination of the substrates 211 and 213 satisfies the predetermined condition in step S204 (step S204: YES), the controlling unit 150 causes the bonding process following step S102 (FIG. 3) to be performed on this combination of the substrates 211 and 213. On the other hand, if it is determined that the combination of the substrates 211 and 213 does not satisfy the predetermined condition in step S204 (step S204: NO), the controlling unit 150 does not perform the bonding of the tentative combination of the substrates 211 and 213, but perform a countermeasure so that these substrates 211 and 213 can satisfy the condition (step S205).

Figure 15:
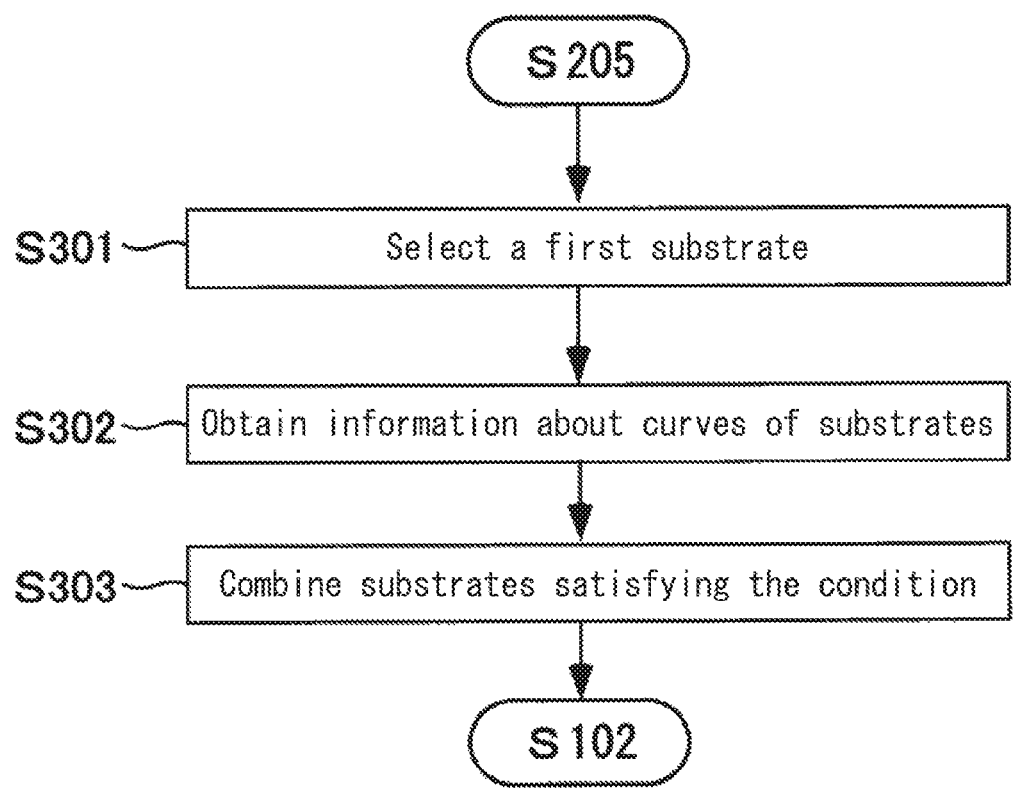
FIG. 15 shows a flow diagram showing a procedure to determine a combination of the substrate 210.

FIG. 15 is a flow diagram describing one of the countermeasures to be performed in the step S205 described above. The controlling unit 150 first determines one first substrate 213 on which the countermeasure will be performed (step S301). Next, the controlling unit 150 obtains the information about the curving measured in step S201 (FIG. 14) for the selected first substrate 213 (step S302).

Then, the controlling unit 150 calculates the range of allowed magnification ratios for the second substrate 211 which can be combined with the first substrate 213, i.e. the range of magnification ratios finally occurring in the second substrate 211 as a result of bonding to the first substrate 213, based on the information obtained for the selected first substrate 213 and the value of difference of the final magnification ratio satisfying the predetermined condition when the stacked substrate 230 is formed by bonding the first substrate 213. Here, the controlling unit 150 calculates the magnification ratio that can offset the joining process magnification ratio occurring in the first substrate 213 in the process of overlaying and specifies the range of values around the value as the allowable range, for example.

Then, the second substrate 211 having a distortion state such as warpage corresponding to the magnification ratio within the range is selected among the plurality of substrates for which the information about curving has already been obtained in step S201 (FIG. 14) and is combined with the first substrate 213 (step S303). Here, the controlling unit 150 estimates the final magnification ratio of the second substrate 211 based on the information about curving such as warpage, and determines the second substrate whose final magnification ratio is within the range described above (step S303). In this way, the combinations of the substrates which can be bonded to form the stacked substrate 230 satisfying a predetermined condition are formed.

In step S303 described above, if the substrates 211 and 213 are overlaid while each of them is flat, it is preferable to combine the first substrate 213 and the second substrate 211 in such a manner that the difference in magnification ratio during the retention to the substrate holders 221 and 213, i.e. the difference in sum of the initial magnification ratio and the flattening magnification ratio between the substrates 211 and 213, is small. The magnification ratios of the substrates 211 and 213 which are retained in the substrate holders 223 and 221 can also be calculated based on the information about the warpage, or estimated from a relationship between the warpage amount and the magnification ratio.

In step S303, when the first substrate 213 retained in the substrate holder 223 having a convex retaining surface and the second substrate 211 retained in the substrate holder 221 having a flat retaining surface are overlaid by releasing the retention of the first substrate 213, a second substrate 211 is combined which makes a difference between (i) the magnification ratio during retention to the substrate holder 221 having a flat retaining surface, i.e. the sum of the initial magnification ratio and the flattening magnification ratio, and (ii) the sum of the initial magnification ratio and the joining process magnification ratio which is the final magnification ratio of the first substrate 213 equal to or less than the threshold. In this case, the relationship between the final magnification ratio and the warpage state of the substrate in the substrates 211 and 213 may be obtained through an experiment in advance.

Also, the magnification ratio of the second substrate 211 which is retained on the substrate holder 221 and the final magnification ratio of the first substrate 213 can be calculated based on information about the curving or the relationship between the warpage amount and the magnification ratio.

In this way, a misalignment due to the difference in magnification ratio can be prevented or suppressed by estimating, in the step of determining the combination of the substrates 211 and 213, the magnification ratios in the step of overlaying the substrates 211 and 213 or the final magnification ratios after the overlaying, based on a distortion such as a warpage of the substrates 211 and 213. Also, a joining failure due to a difference in magnification ratio is prevented by combining the substrates 210 which make a difference in magnification ratio in the step of overlaying equal to or less than the threshold.

Also, the misalignment can be at least reduced by combining the substrates 210 with a small difference in magnification ratio in the step of overlaying, and furthermore, a misalignment can be eliminated with a small correction even when the substrates 210 are corrected in any manner as described below. Further, an alignment in the overlaying unit 300 can be accelerated and the throughput of the stacked substrate manufacturing apparatus 100 can be improved by suppressing the difference in magnification ratio by determining the combination of the substrates before the step of aligning in the overlaying unit 300 or before the detection of alignment marks.

It is noted that while the determination of the combination based on the information about the curving of the substrate 210 is preferably prior to the step of overlaying the substrates 211 and 213 (step S103 shown in FIG. 3) as described above, and is also preferably prior to the activation of the front surfaces of the substrates 211 and 213 to be overlaid (step S106 shown in FIG. 3). Thus, an unnecessary activation of the substrates 211 and 213 can be avoided when the combination of the substrates to be overlaid cannot be determined despite having activated the substrates 211 and 213.

In the implementation described above, if a combination with the magnification ratio difference within the allowable range cannot be determined for the substrates 210 in one lot or cassette, a range of candidates for combination may be expanded to other lots or other substrate cassettes 120. In this case, a cassette may be provided to accommodate the substrates 210 for which a combination cannot be determined, and which wait in the cassette until substrates 210 to be combined are found.

In the implementation described above, the combination of the first substrate 213 and second substrate 211 is determined based on the amount of misalignment, magnification ratio, and the like which are estimated from the information about the curving of the first substrate 213 and the second substrate 211. Alternatively, the combination may be determined based on a distortion state such as a distortion type and a distortion amount of the first substrate 213, and the distortion state of the second substrate 211. The distortion state is part of the information about a curving and includes warpage states such as a warpage shape and a warpage amount. In this case, the condition to be satisfied for the combination includes such a condition that the combination of the distortion state of the first substrate 213 and the distortion state of the second substrate 211 corresponds to the predetermined combination of the distortion state. In this way, the combination can be determined based on a shape such as a distortion state in the first substrate 213 and the second substrate 211.

Also, in the implementation described above, the combination of the substrates 211 and 213 may be determined in consideration of a local warpage of the substrates 211 and 213. A warpage state in the warpage region of the substrates 211 and 213 can be measured and estimated in a similar way to the global warpage described above, and also, information about local warpage can be associated with distortion. In this case, substrates are combined in such a manner that the warpage states of the two opposing substrates 211 and 213 are in a mirror image relationship about the plane along the front surfaces of the two substrates 211 and 213. When these two combined substrates 211 and 213 are joined, it is preferable to release the both substrates 211 and 213 from the substrate holders 221 and 213. In this way, since equivalent distortions can be generated in the locally warped regions of both of the substrates 211 and 213, the misalignment due to the difference in distortion in the local warpage regions is suppressed.

Figure 16:
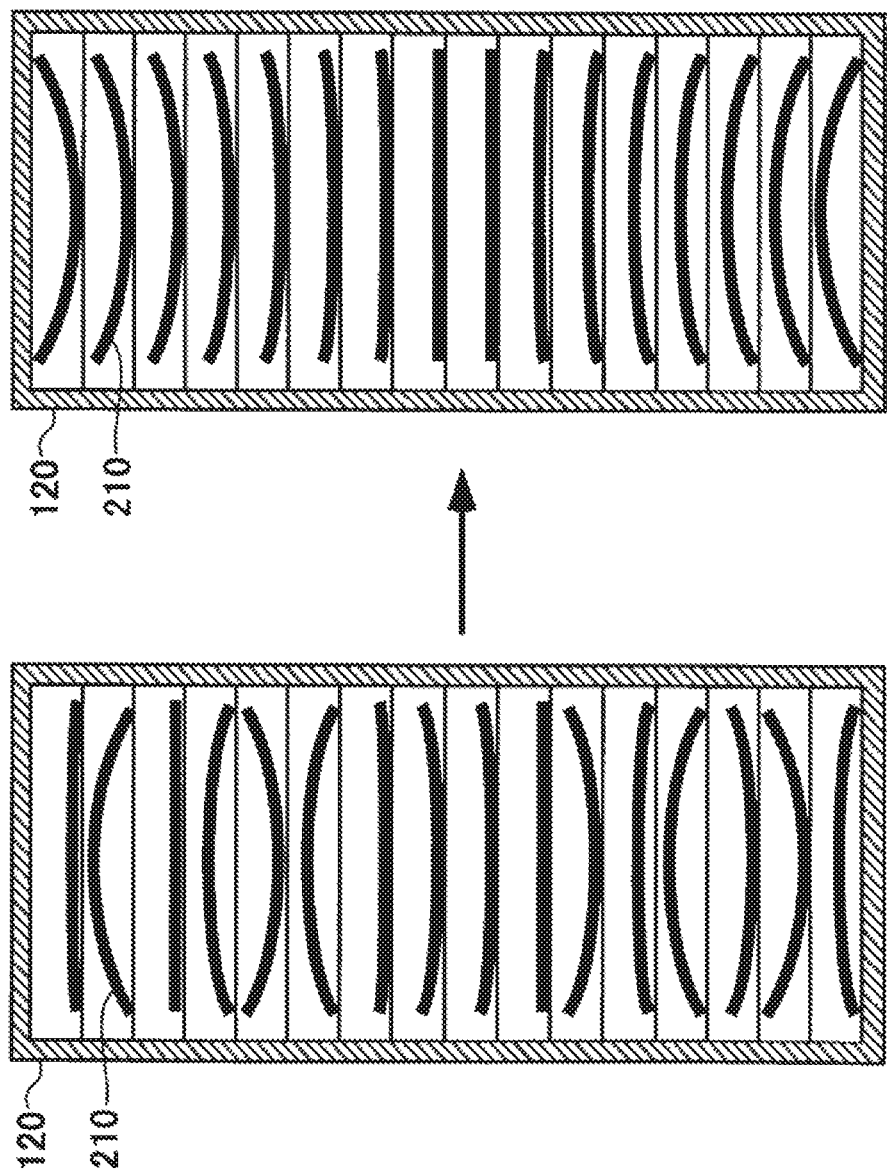
FIG. 16 shows a schematic view describing a method of determining a combination of the substrate 210.

At first, substrates 210 provided for overlaying randomly has various warpage states as shown in the left side in the figure of FIG. 16. Therefore, once the controlling unit 150 in the stacked substrate manufacturing apparatus 100 obtains information about the curving of each of the substrates 210 in step S201, it obtains the information about the curving of the substrates 210 included in one lot or the substrate cassette 120 based on the obtained information, and then organizes the substrates 210 according to the magnitude of warpage.

Here, the controlling unit 150 processes he arrangement of the substrates 210 and associates the codes identifying the substrates 210 with the accommodated positions in the substrate cassette 120, without moving the substrates 210, in such a manner that a plurality of substrates 210, for example, accommodated in one substrate cassette 120 may be ordered. In this way, sequentially overlaying and combining the plurality of ordered substrates 210 makes the magnification ratio difference uniform in the cassette or the lot, which makes it possible to manufacture the generally high quality stacked substrates 230.

On the other hand, a pair of the substrates 210 with the misalignment equal to or less than the threshold is accommodated side-by-side in the substrate cassette 120 by means of a sorter and the like so that the controlling unit 150 in the stacked substrate manufacturing apparatus 100 can select the appropriate combinations and perform bonding by simply processing the substrates 210 in the substrate cassette 120 in a sequential order. Thus, the load on the controlling unit 150 is reduced, and the throughput can be improved.

Also, as described below, instead of determining the combination of the substrates 210 in the stacked substrate manufacturing apparatus 100, the combination may be determined by an apparatus other than the stacked substrate manufacturing apparatus 100.

In this case, the apparatus other than the stacked substrate manufacturing apparatus 100 measures shapes including the warpage of the substrate 210. The other apparatus includes a substrate processing apparatus which processes the substrates 210 to be joined in a step before the joining, for example, an exposure apparatus, a film deposition apparatus, a polishing apparatus, and the like.

Based on this information about the shape of the distorted substrate 210, the plurality of substrates 210 are sorted to individual substrate cassettes 120 according to, for example, the warpage amounts. Alternatively, the identification information which identifies each substrate 210 and the information about the curving of each substrate 210 are associated and stored within one substrate cassette 120. This sorting may be done by using a sorter. If the sorting is done in the same lot, the substrates 210 do not have to be relocated from the cassette in which they are originally accommodated to a dedicated substrate cassette. On the other hand, if they are sorted across the lots, they may be relocated to a dedicated substrate cassette, or a plurality of substrate cassettes may be arranged and installed in the stacked substrate manufacturing apparatus.

The controlling unit in the substrate processing apparatus reads data in which a plurality of substrates 210 and the information about the curving are associated from a data server storing the data and determines the combination, or outputs an indication signal for performing a combination to the combination processing unit which determines the combination for the processing. The controlling unit in the substrate processing apparatus outputs to the stacked substrate manufacturing apparatus 100 a signal which indicates an instruction to join a pair of the combined substrates 210. Based on the signal received from the controlling unit in the substrate processing apparatus, the stacked substrate manufacturing apparatus 100 joins the substrates within the installed substrate cassette according to the instruction from the controlling unit in the substrate processing apparatus.

Figure 17:
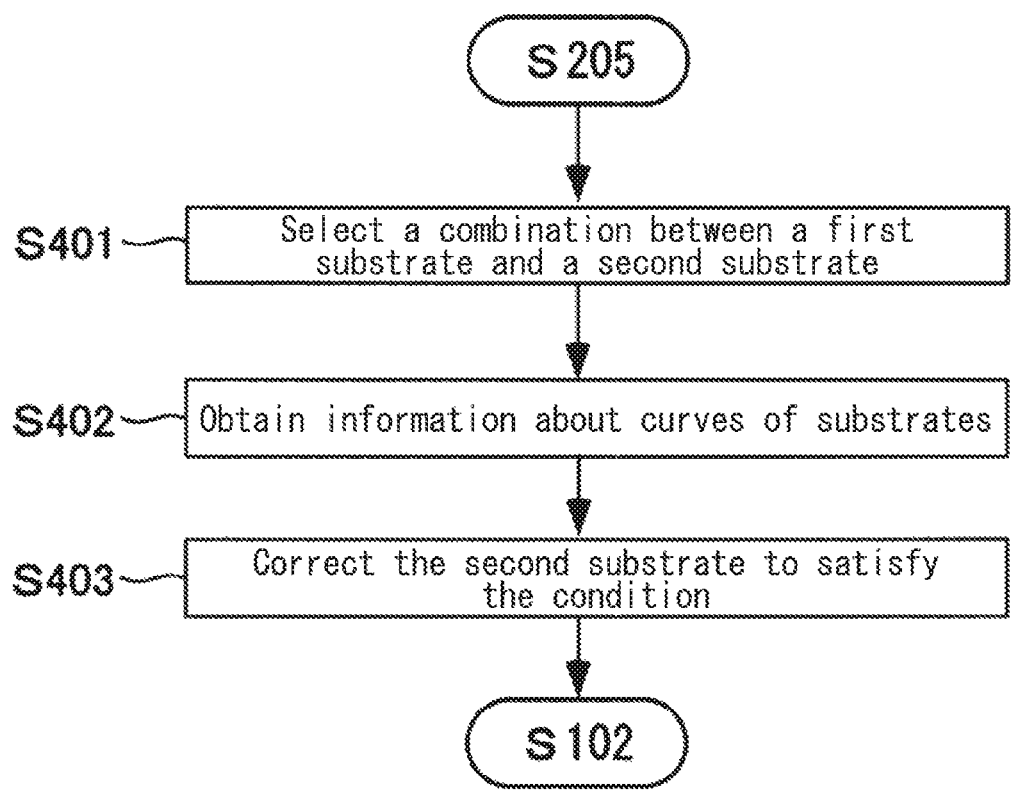
FIG. 17 shows a flow diagram showing a procedure to determine a combination of the substrate 210.

FIG. 17 shows a flow diagram describing one of the procedures in the countermeasure performed in step S205 (FIG. 14). First, the controlling unit 150 selects any combination of a first substrate 213 and a second substrate 211 from a group of substrates 210 whose information about the curving of the substrates is collected (step S401). In other words, the controlling unit 150 serves as a selecting unit which selects a combination of the first substrate 213 and the second substrate 211 which satisfies a predetermined condition from a plurality of substrates 210. However, the selected combination in the step S401 is a combination which has already been determined not to satisfy the condition in step S204 (FIG. 14).

Next, the controlling unit 150 obtains the information about the curving measured in step S201 (FIG. 14) for the selected pair of substrates 211 and 213 (step S402). Thus, the controlling unit 150 can learn the deviation of the final magnification ratio in this combination of the first substrate 213 and the second substrate 211 from a given condition, and calculate the amount of the correction which should be performed for the condition to be satisfied. In other words, the controlling unit 150 serves as an estimating unit which estimates the amount of misalignment between the two substrates 211 and 213 which occurs when they are bonded. Here, the correction amount refers to the distortion amount to be generated on at least one of the two substrates 210 in such a manner that the misalignment between the two substrates 211 and 213 joined with each other becomes equal to or less than the threshold.

Therefore, the estimated magnification ratio is changed by changing the distortion state of at least one of the substrates 211 and 213 by the substrate holder 223, a correcting unit 602 described below, and the like (step S403) so that the final magnification ratio of the selected first substrate 213 approaches the magnification ratio of the design specification.

It is noted that the distortion amount of the substrates 211 and 213 may be changed by changing the shapes of at least one of the substrates 211 and 213 while the substrates 211 and 213 are not overlaid. Also, while the shape of each of the substrates 211 and 213 may be changed in accordance with the design specification, the shape of one of the substrates 211 and 213 to be stacked may be changed in such a manner that the one of the substrates 211 and 213 matches the other. Also, the nonlinear distortion and the like of the substrate recorded as the information about the substrates 211 and 213 described above may be corrected as well.

Further, the controlling unit 150 may calculate an initial magnification ratio corresponding to the magnification ratio occurring in the process of overlaying such as a joining process magnification ratio and determine the second substrate 211 having a magnification ratio whose difference from the calculated initial magnification ratio is equal to or less than the threshold.

Still further, the controlling unit 150 corrects the determined magnification ratio of the second substrate 211 by the correcting unit 601, 602, 603, and the like, to ensure that the magnification ratio difference between the substrates 211 and 213 which occurs following the overlaying is equal to or less than the threshold. Thus, the magnification ratio difference between the substrates 211 and 213 in the stacked substrate 230 can be significantly reduced.

It is noted that if it is found that the predetermined condition cannot be satisfied by correcting either of the substrates 211 and 213 in step S403, the combination of the substrates 211 and 213 may be changed according to the procedure shown in FIG. 14. Also, the substrates 211 and 213 for which a combination is not still found may be removed from the process, and be ready until a substrate which can be combined emerges.

Further, in the example described above, the substrates 211 and 213 are processed on condition that the substrates 211 and 213 to be bonded satisfy the initial condition. However, for example, in a step to select another substrate 211 after a combination of the substrates 211 and 213 which cannot satisfy the condition occurs, the condition may be relaxed by adding another predetermined value to the initial threshold. Thus, the decrease in the precision is suppressed within the range which is assumed in advance, and also the yields of the substrates 211 and 213 can be improved.

Figure 18:
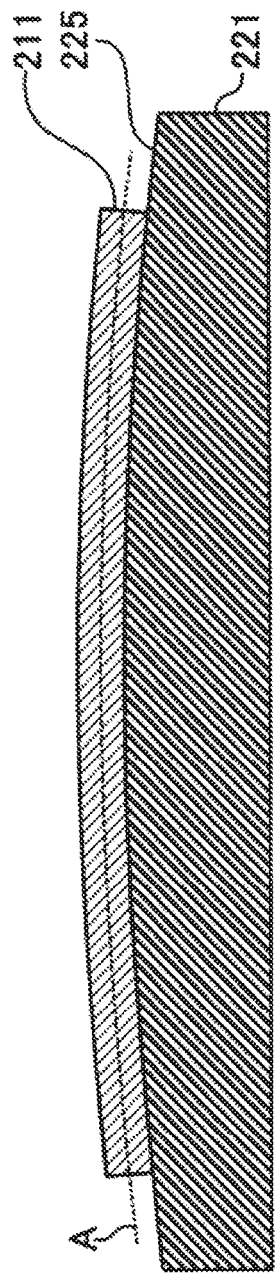
FIG. 18 shows a schematic cross sectional view of the substrate holder 221 retaining the substrate 211.

FIG. 18 is a figure to describe a method of correcting the initial magnification ratio of the substrate 210, as one of the methods to correct the distortion of the substrate 210 in step S403 (FIG. 16). This figure shows the state in which the substrate 211 is retained on the substrate holder 221.

Here, the substrate holder 221 has a sectional shape whose thickness gradually increases from the circumferential portion toward the center portion. Thus, it has a curved retaining surface 225. The substrate 211 which attracts to and is retained on the substrate holder 221 closely attaches to the retaining surface 225 and curving along the shape of the retaining surface 225. Therefore, if the front surface of the retaining surface is a curved surface, for example, a cylindrical surface, a spherical surface, a paraboloid surface, and the like, the shape of the attracted substrate 213 also changes to form such a curved surface.

If the substrate 211 is attracted to the retaining surface 225 with such a shape, in a state in which the substrate 211 is curved, in comparison to the center portion A in the thickness direction of the substrate 213 which is indicated with a one dot chain line in the figure, on the front surface which is the upper surface of the substrate 211 in the figure, the shape changes in such a manner that the front surface of the substrate 211 spreads in the surface direction from the center toward the circumferential portion. Also, on the back surface which is the lower surface of the substrate 211 in the figure, the shape changes in such a manner that the front surface of the substrate 211 reduces in the surface direction from the center to the circumferential portion.

In this way, when the substrate 211 is retained to the substrate holder 221, the front surface of the substrate 211 on the upper side in the figure is enlarged relative to the substrate 211 in the flat state. These changes in shape can correct the misalignment due to the magnification ratio difference from the other substrate 213. It is noted that the correction amount for the magnification ratio can be adjusted by preparing a plurality of substrate holders 221 with various curvatures of the curved retaining surface 225.

Figure 19:
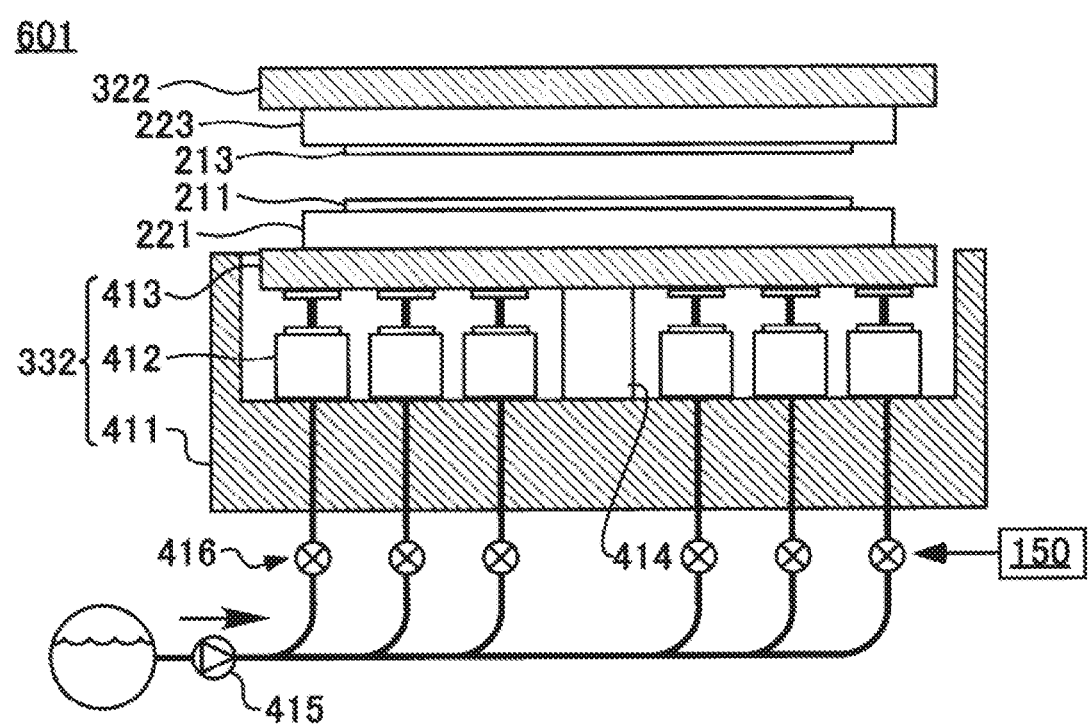
FIG. 19 shows a schematic cross sectional view of the correcting unit 601.

FIG. 19 is a schematic cross sectional view of the correcting unit 601, as an example of the curving unit, which can be incorporated into the overlaying unit 300. In the illustrated example, the correcting unit 601 is provided on the lower stage 332 of the overlaying unit 300, and used for the case in which the shape of the substrate 211 is changed to be curved for correction in step S403 described above (see FIG. 17).

The correcting unit 601 includes a base 411, a plurality of actuators 412, and an attracting unit 413. The base 411 supports the attracting unit 413 through the actuators 412.

The attracting unit 413 has an attracting mechanism such as vacuum chuck and electrostatic chuck, and forms an upper surface of the lower stage 332. The attracting unit 413 attracts to and retains the imported substrate holder 221.

The plurality of actuators 412 are placed below the attracting unit 413 along the lower surface of the attracting unit 413. Also, the plurality of actuators 412 are driven individually by the working fluid provided through a pump 415 and a valve 416 from the outside under control of the controlling unit 150. Thus, the plurality of actuators 412 individually expands or contracts in the direction of thickness of the lower stage 332, i.e. the overlaying direction of the substrates 211 and 213, with the different expansion and contraction amounts, to raise or lower the region of the attracting unit 413 to which the plurality of actuators 412 is connected.

Also, the plurality of actuators 412 are each connected to the attracting unit 413 via links. The center portion of the attracting unit 413 is connected to the base 411 via a support column 414. When the actuators 412 move in the correcting unit 601, the front surface of the attracting unit 413 in the region to which the actuator 412 is connected displaces in the thickness direction.

Figure 20:
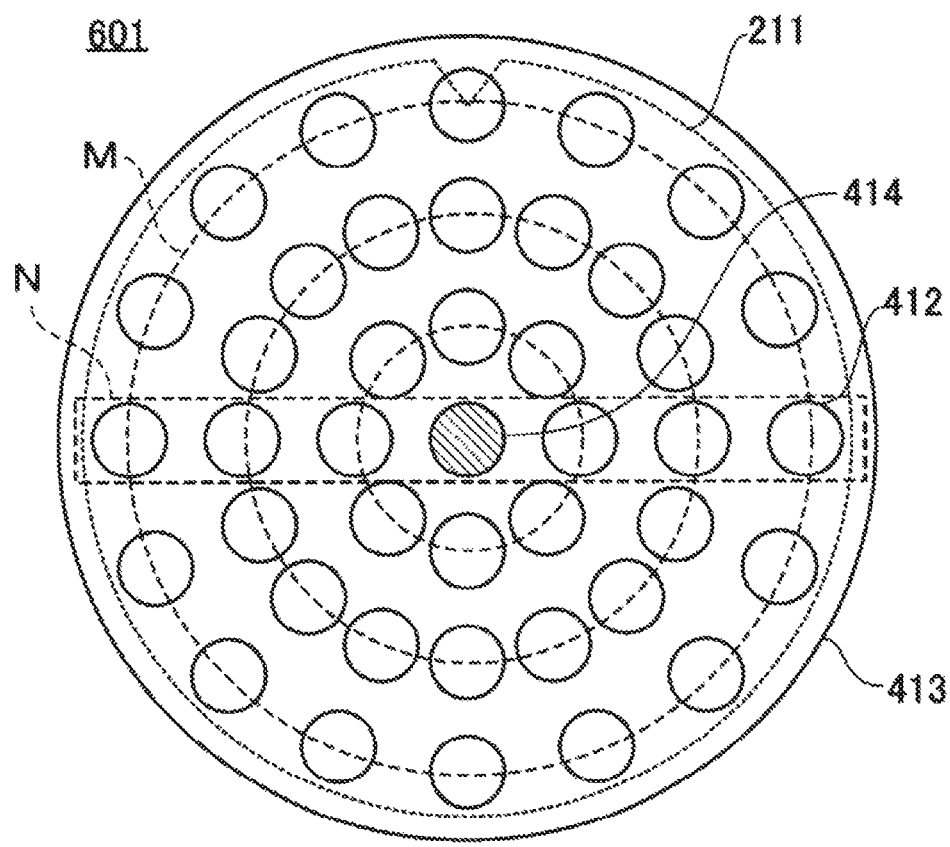
FIG. 20 shows a schematic view showing a layout of the actuator 412.

FIG. 20 is a schematic plan view of the correcting unit 601 and shows a layout of the actuator 412 in the correcting unit 601. In the correcting unit 601, the actuators 412 are placed radially around the support column 414. The arrangement of the actuators 412 can also be regarded as concentric with the support column 414 as the center. The arrangement of the actuators 412 is not limited to the illustrated ones, but the arrangement in, for example, a grate or spiral manner or the like is also possible. Thus, the substrate 211 can also be corrected by changing the shape in concentric, radial, spiral manners and the like.

Figure 21:
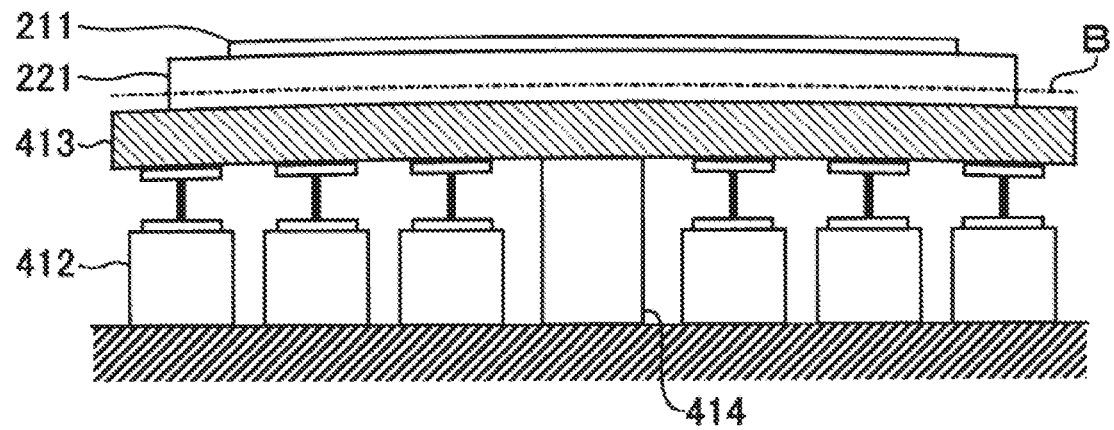
FIG. 21 shows a schematic view showing an operation of the correcting unit 601.

FIG. 21 describes an operation of the correcting unit 601. As illustrated, the shape of the attracting unit 413 can be changed by individually opening and closing the valves 416 to expand and contract the actuators 412. Therefore, if the substrate holder 221 attracts to the attracting unit 413 and the substrate holder 221 retains the substrate 211, the shapes of the substrate holder 221 and the substrate 211 can be changed to be curved by changing the shape of the attracting unit 413.

As shown in FIG. 20, the actuators 412 can be regarded as being arranged in a concentric manner, or in the circumferential direction of the lower stage 332. Thus, as indicated by the dotted line M in FIG. 20, by grouping the actuators 412 at the same distance from the center together and increasing the driving amounts toward the circumferential edge, the center area of the front surface of the attracting unit 413 is raised in such a manner that the shape of the front surface of the attracting unit 413 can be changed into a spherical surface, a paraboloid surface, a cylindrical surface, and the like.

Thus, the shape of the substrate 211 can be changed to be curved along a spherical surface, paraboloid surface, and the like, as in the case that the substrate 211 is retained on the curved substrate holder 221. Therefore, the correcting unit 601 changes the shape in such a manner that, in the upper side of the substrate 211 in the figure, the front surface of the substrate 211 spread in the surface direction relative to the center portion B in the thickness direction of the substrate 213, indicated with the one dot chain line in the figure. Also, in the lower side of the substrate 211 in the figure, the shape is changed in such a manner that the front surface of the substrate 211 contracts in the surface direction. Further, a nonlinear distortion can also be corrected by curving and changing the shape of the substrate 211 to the other shapes such as cylindrical surface, or a shape including a plurality of bumps and indentations by individually controlling the expansion and contraction amount of a plurality of actuators 412.

Therefore, the deviation from the design specification of the circuit region 216 in the front surface of the substrate 211 can be entirely or partially adjusted by individually operating the actuators 412 of the correcting unit 601 through the controlling unit 150. Also, the change amount of the shape can be adjusted by changing the moving amounts of the actuators 412.

In the example described above, the attracting unit 413 has a shape whose center is raised. However, the magnification ratio of the circuit region 216 on the front surface of the substrate 211 can also be reduced by increasing the moving amounts of the actuators 412 in the circumferential portion of the attracting unit 413 for depressing the center portion of the attracting unit 413 relative to the circumferential portion.

Also, in the example described above, the correcting unit 601 is incorporated into the lower stage 332 of the overlaying unit 300, but the correcting unit 601 may be incorporated into the upper stage 322 and the substrate 213 may be corrected on the upper stage 322. Still further, the correcting unit 601 may be incorporated into both the upper stage 322 and the lower stage 332. Further, the correction may be shared by the upper stage 322 and the lower stage 332. The correction of the magnification ratios of the substrates 211 and 213 is not limited to the method described above and other correction method may be further introduced such as heat expansion or heat contraction through temperature adjustment.

Figure 22:
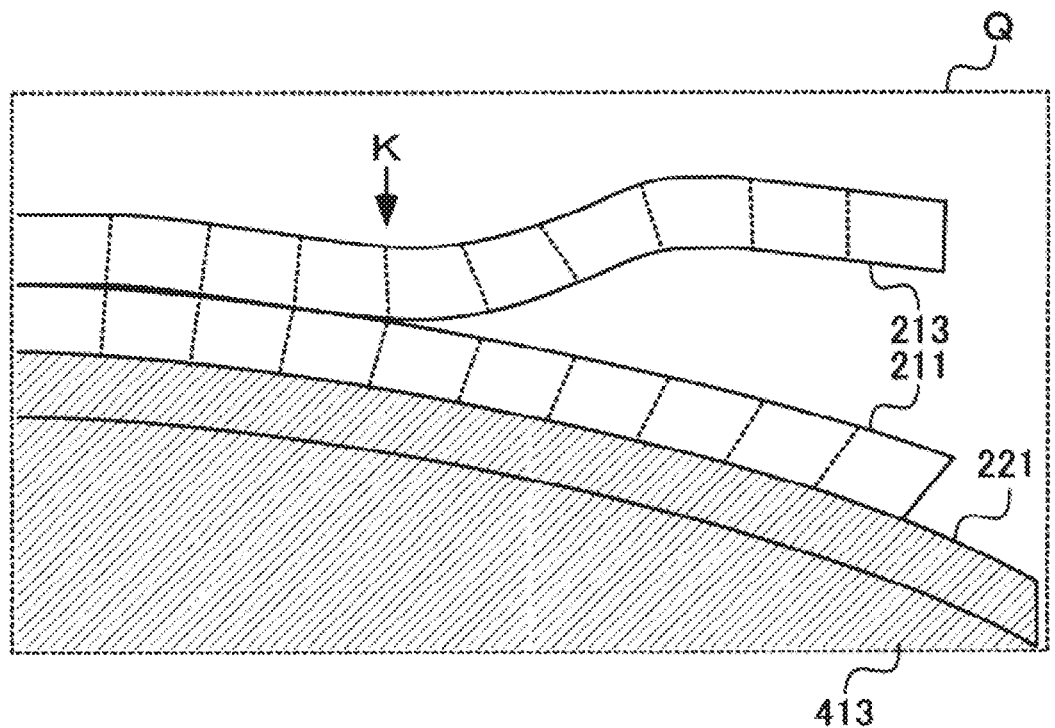
FIG. 22 shows a partially enlarged view showing an overlaying process of the substrates 211 and 213.

FIG. 22 is a figure to describe a method of correcting the joining process magnification ratio of the substrate 210, as one of the methods to correct the distortion of the substrate 210 in step S403 (FIG. 16). The substrate 211 in the lower side in the figure is retained on the substrate holder 221 with the raised center so that the magnification ratio is increased. Here, the corrected magnification ratio of the substrate 211 takes the joining process magnification ratio of the substrate 213 into account. Therefore, the deviation due to the difference in magnification ratio between the substrates 211 and 213 is reduced.

The retaining surface 225 of the substrate holder 221 has a shape with the raised center. However, by preparing the substrate holder 223 with the depressed center portion relative to the circumferential portion of the retaining surface 225 to retain the substrate 211, the magnification ratio in the front surface of the substrate 211 can be reduced and the misalignment relative to the design specification of the circuit region 216 can be adjusted.

Figure 23:
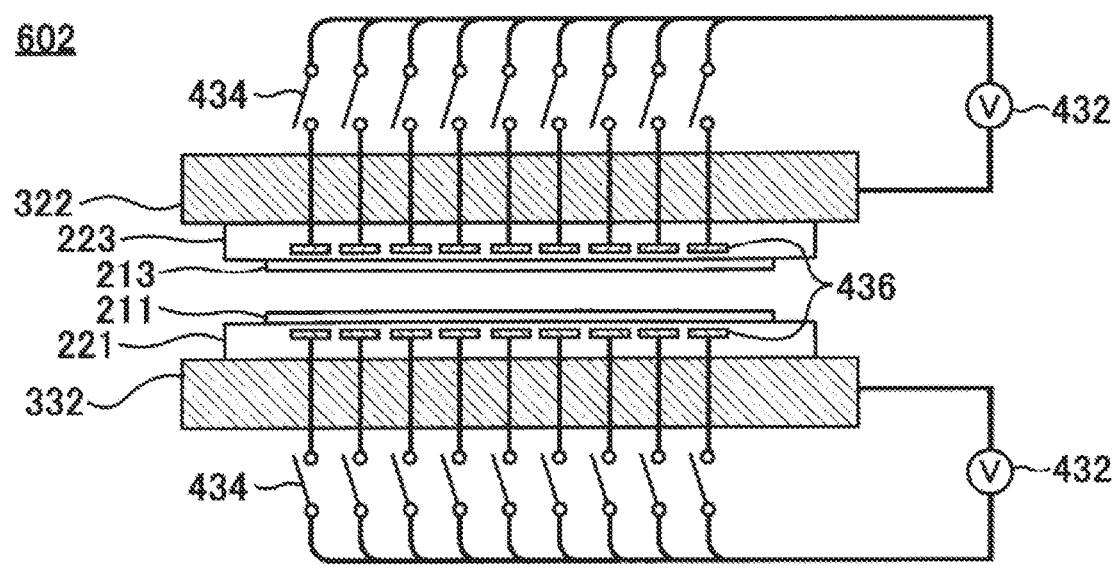
FIG. 23 shows a schematic view describing an operation of the correcting unit 602.

FIG. 23 shows a schematic cross sectional view of another correcting unit 602 which can be incorporated in the overlaying unit 300 and correct the joining process magnification ratio of the substrates 211 and 213. The correcting unit 602 is incorporated into the substrate holders 221 and 223 used in the overlaying unit 300. This correcting unit 602 can be used together with the substrate holder 221 with the curved retaining surface 225, the correcting unit 601 described above, and the like. Also, the correcting unit 602 can be used together with the electrostatic chuck used when the substrate 211 attracts to the substrate holder 221.

The correcting unit 602 includes switches 434, electrostatic chucks 436, and a voltage source 432. The electrostatic chucks 436 are embedded in the substrate holders 221 and 223. Each of the electrostatic chucks 436 is connected to the common voltage source 432 via individual switch 434. Thus, when the switches 434, which open and close under the control of the controlling unit 150, closes, the electrostatic chucks 436 generate attracting force on the front surface of the substrate holders 221 and 223, with which the substrates 211 and 213 are attracted.

The electrostatic chucks 436 in the correcting unit 602 are distributed across the entire retaining surface, in the substrate holders 221 and 223, which retains the substrate 213. Thus, each of the substrate holders 221 and 223 has a plurality of attracting regions. Therefore, when any one of the switches 434 is closed, the corresponding electrostatic chuck 436 generates attracting forces, and applies the attracting forces to the substrates 211 and 213 at any position in the retaining surface of the substrate holder 223. It is noted that when all the switches 434 are closed, all the electrostatic chucks 436 generate attracting forces and securely retain the substrates 211 and 213 to the substrate holders 221 and 223.

Figure 24:
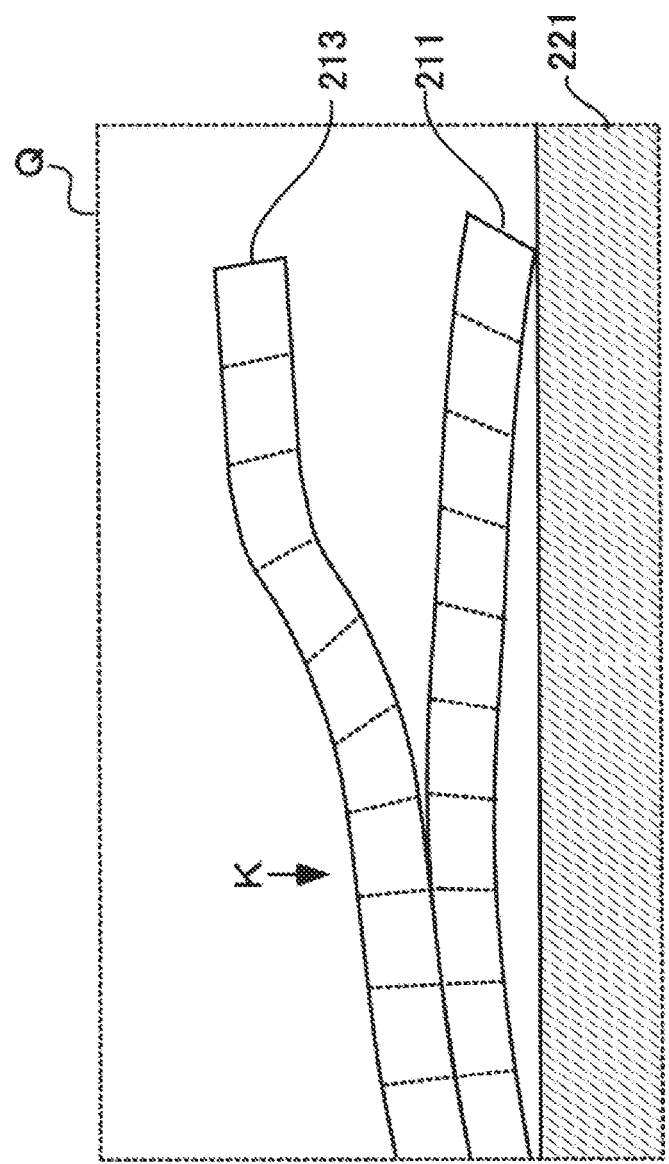
FIG. 24 shows a schematic cross sectional view of the correcting unit 602.

FIG. 24 describes a correction operation of the correcting unit 602. FIG. 24 shows a part of the substrates 211 and 213 in the process of overlaying in a similar manner to FIG. 22.

In the process of overlaying, when an attracting force is applied to the substrate 213 in the region near the boundary K, in which a change in the shape of the substrate 213 occurs, from above in the figure by the correcting unit 602, more significant change in the shape occurs in the substrate 213 than when the correction is not performed. Thus, a correction can be done to increase the expansion amount of the substrate 213 in the region on which the electrostatic chuck 436 is activated.

Also, in the overlaying process, the lower substrate 211 rises up from the substrate holder 221 and curving due to the pulling force from the upper substrate 213 in the region where the retention of the substrate 211 to the substrate holder 221 is partially released. Thus, since the shape of the lower substrate 211 changes in such a manner that the front surface expands, the difference in expansion amount from the front surface of the upper substrate 213 is reduced by this expansion amount. Therefore, the misalignment due to the magnification ratio difference between the substrates 211 and 213 can be reduced by adjusting the curving amount, i.e. the expansion amount of the substrate 211.

It is noted that if the retention of the substrate 211 is released from the lower stage 332 for correction, the retaining force may merely be reduced, instead of being eliminated completely. In this way, by adjusting the retaining force of the substrate 211 to the substrate holder 221, the magnification ratio of the substrate 211 can also be adjusted so that the misalignment due to the magnification ratio difference from the substrate 213 can be corrected.

In this way, the operation of the correcting unit 602 can suppress the mutual difference in magnification ratio between the substrates 211 and 213. Also, the electrostatic chucks 436 distributed across the entire substrate holders 221 and 223 can individually generate or shut off the attracting force. Therefore, the correcting unit 602 can make correction despite of the intricately distributed non-uniform expansion amounts in the substrates 211 and 213.

It is noted that in the example described above, the substrates 211 and 213 are overlaid by releasing the substrate 213 retained on the upper stage 322 all at once toward the substrate 211 retained on the lower stage 332 for the autonomous joining of the substrate 213. However, the spread of the contact region between the substrates 211 and 213 i.e. the moving speed, moving time, moving direction, and the like of the boundary K may be controlled by sequentially eliminating the attracting forces of the electrostatic chucks 436 from the center portion of the substrate toward the outer portion in the surface direction of the upper stage 322 to suppress the autonomous joining of the substrate 213. This can suppress the increase in the magnification ratio difference toward the perimeter, which is caused by the accumulation of the change in the magnification ratio toward the perimeter.

Figure 25:
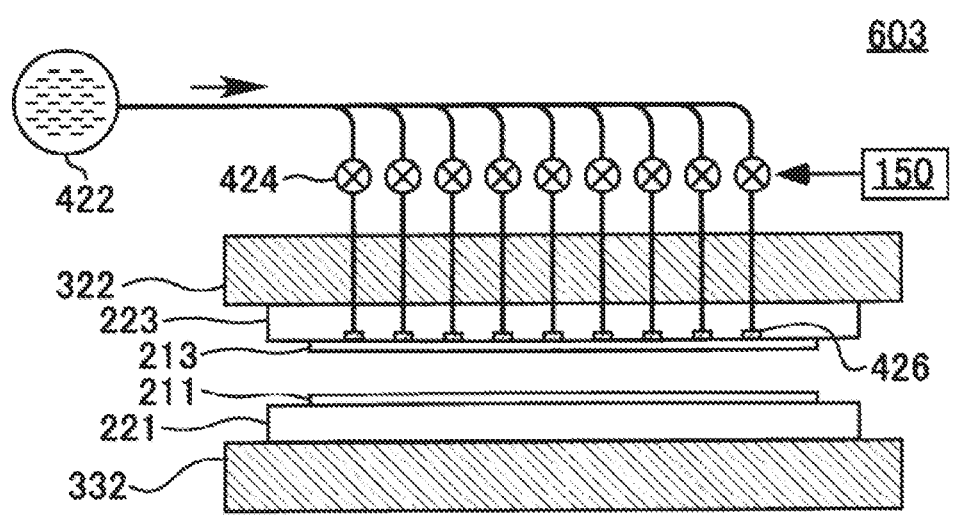
FIG. 25 shows a schematic cross sectional view of the correcting unit 603.

FIG. 25 shows a schematic cross sectional view of another correcting unit 603 which can be incorporated in the overlaying unit 300 and correct the joining process magnification ratio of the substrates 211 and 213. The correcting unit 603 is incorporated into the substrate holder 223 used in the upper stage 322 in the overlaying unit 300.

The correcting unit 603 is provided on the substrate holder 223 and includes a plurality of openings 426 which open toward the substrate 213 retained on the substrate holder 223. One end of each of the openings 426 is communicated to the pressure source 422 through the upper stage 322 and via the valve 424. The pressure source 422 is, for example, pressurized fluid such as compressed dry air. The valves 424 individually open or close under control of the controlling unit 150. If the valve 424 opens, pressurized fluid is sprayed from the corresponding opening 426.

Figure 26:
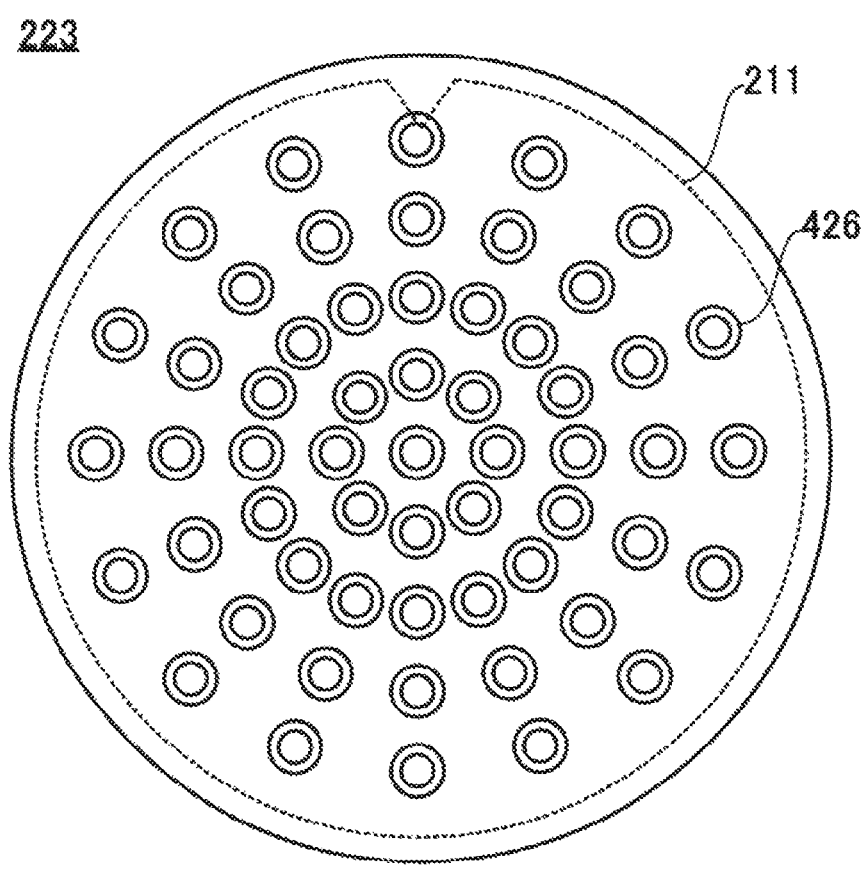
FIG. 26 shows a schematic plan view of the correcting unit 603.

FIG. 26 shows the layout of the openings 426 in the correcting unit 603. The openings 426 are placed on the entire retaining surface retaining the substrate 213 to the substrate holder 223. Therefore, by opening any of the valves 424, pressurized fluid can be sprayed downward in the figure at any positions in the retaining surface of the substrate holder 223.

The substrate holder 223 retains the substrate 213 with, for example, the electrostatic chuck. The electrostatic chuck can eliminate the attracting force by interrupting the power supply, but there is a time lag until the substrate 213 retained on the residual charge and the like is released. However, the substrate 213 can immediately be released by spraying pressurized fluid from the openings 426 placed on the entire substrate holder 223 immediately after the power feeding to the electrostatic chucks is interrupted.

Figure 27:
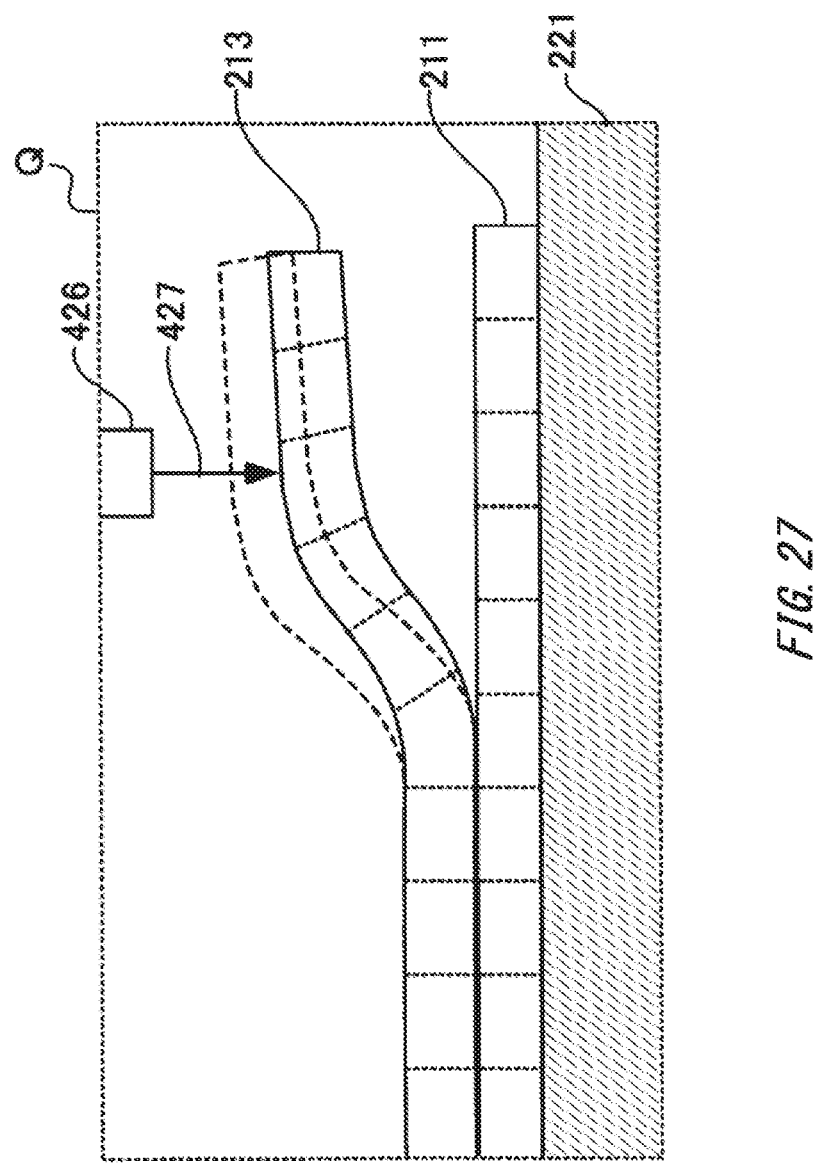
FIG. 27 shows a schematic view describing an operation of the correcting unit 603.

FIG. 27 is a schematic view showing the correction operation of the correcting unit 603. FIG. 27 shows a part of the substrates 211 and 213 in the process of overlaying in a similar manner to FIG. 24.

In the process of overlaying, once the correcting unit 603 sprays a pressurized fluid 427 from above in the figure to the region near the boundary K in which the shape of the substrate 213 changes, the substrate 213 is pressed against the other substrate 211 and the change amount of the shape decreases. Thus, a correction can be done to reduce the expansion amount of the substrate 213 in the region on which the pressurized fluid is sprayed.

In this way, since the correcting unit 603 can operate to suppress the expansion in the substrate 213, the misalignment due to the magnification ratio difference between the substrates 211 and 213 can be corrected. It is noted that the openings 426 can individually spray the pressurized fluid in the correcting unit 603. Therefore, even if the distribution of the expansion amounts of the substrate 213 to be corrected is non-uniform, the correction can be performed with different correction amount for each region in the substrate 213.

It is noted that the example described above describes the case in which the correcting unit 603 is provided on the upper stage 322. However, in the overlaying unit 300 with the structure in which the substrate 211 retained on the lower stage 332 is released and bonded to the substrate 213, the correcting unit 603 may be provided on the lower stage 332 and the expansion amount of the substrate 211 in the lower side in the figure may be corrected. Further, the correcting units 603 may be provided on both of the lower stage 332 and the upper stage 322, and the corrections may be performed on both of the substrates 211 and 213.

Also, in addition to suppressing the magnification ratio difference by combining the substrates 211 and 213 as described in reference to FIG. 15, the magnification ratio correction using the substrate holder 221 having the retaining surface 225 with the curved surface shown in FIG. 18, and the magnification ratio correction using the correcting unit 601 shown in FIG. 19 and the like, the correcting unit 602 shown in FIG. 23, the correcting unit 603 shown in FIG. 25 and the like, and the like may be used together.

In this case, in the step of determining the combination of the two substrates 211 and 213 which meets the predetermined condition, a combination is determined in which the amount of misalignment between the two substrates 211 and 213 has such a magnitude that can be corrected with the correcting methods and units described above. In other words, a combination of substrates 211 and 213 is determined in which the difference between the amount of misalignment of the substrates 211 and 213 and the threshold of the amount of misalignment, i.e. the needed amount of the correction, is smaller than the maximum amount of the correction of the correcting methods and units described above.

This can suppress the misalignment due to the distortion difference which could not be eliminated when determining the second substrate 211 in accordance with the first substrate 213 based on the information about the curving. Therefore, the number of the combinations can be increased using the correcting methods and units even if the combination in which the amount of misalignment is equal to or less than the threshold cannot be determined.

It is noted that the amount of the correction by the substrate holder 221 can be adjusted, since the projecting amount of the substrate holder 221 can be continuously changed by using the correction mechanism having the actuator 412 and the like to change the shape of the substrate holder 221 having the curved retaining surface 225. Also, the correction amount for the warpage, distortion, and the like of the substrates 211 and 213 can be adjusted with the correction mechanism which utilizes a temperatures difference between the substrates 211 and 213, attracting forces to the substrates 211 and 213, and the like. Thus, the correction range is expanded and the utilization efficiency of the substrate 210 can be further improved.

Also, when the misalignment between the substrates is corrected with the correction mechanism based on the information about the curving of the substrate as in the example described above, the information obtained by the obtaining unit may be the information such as a correction method or a correction amount for correcting distortions. Further, information obtained by the obtaining unit may be information for calculating a correction amount, other than a correction amount. Here, the examples of information other than the correction amount include, for example, the lot number of the substrate 210, the ID of the equipment used for processing the substrate 210 in the pre-process, the history of the process done for the substrate 210 until overlaying, the specification of the substrate 210, and the like.

Also, when the misalignment is corrected using the correcting methods and units described above in the procedure shown in FIG. 17, the predetermined condition in S404 of FIG. 17 may be whether or not the amount of misalignment between the two substrates 211 and 213 calculated or estimated from information about the curving of the two substrates 211 and 213 or the difference between the amount of misalignment and the threshold of the amount of misalignment, i.e. the needed correction amount is equal to or less than the magnitude which can be corrected with the correcting methods and units described above. If this condition is satisfied, the correction is done with the correcting methods and units described above, or if the condition is not satisfied, the combination of substrates which satisfies the condition is determined according to the steps shown in FIG. 15.

In this way, the substrates 211 and 213 which are suited for stacking can be combined by obtaining information about the curving of the substrates 211 and 213 in advance and estimating the distortion or the misalignment including the magnification ratio which occurs after the overlaying. Thus, the stacked substrates 230 in which the misalignment due to the magnification ratio and the like is equal to or less than the threshold can be manufactured efficiently. Also, even if the substrates 211 and 213 to be overlaid have a difference in magnification ratio and the like, a correction to suppress the magnification ratio difference can be performed efficiently, and the productivity and the yield of the stacked substrate 230 with a small misalignment can be improved.

Alternatively, in the implementation described above, a difference between the magnification ratio estimated from information about the curving of the substrates 211 and 213, and the magnification ratio before joining or the magnification ratio after joining measured with the global alignment or the enhanced global alignment based on the alignment mark 218 on the substrates 211 and 213 is obtained, and this difference may be reflected to the threshold and the like for the next measurement and determination if the difference is larger than the predetermined threshold. Thus, the precision for the alignment of the substrates 211 and 213 can be further improved.

In this case, the controlling unit 150 may calculate and record the distortion state of the substrates 211 and 213, as information about the substrates 211 and 213, based on the position information of the alignment marks 218, for each substrates 211 and 213, or, if the combination of the substrates 211 and 213 to be overlaid has been determined, for each combination thereof.

Also, in addition to or as an alternative to the implementation described above which shows the example to determine whether the combination is appropriate or not based on the state of the magnification ratio distortion which occurred in the substrates 211 and 213, alternatively, it is also possible to determine whether the combination is appropriate or not based on the state of the orthogonal distortion which occurred in each of the substrates 211 and 213. If an orthogonal distortion occurs in each of the two substrates 211 and 213, one of the substrates are rotated to detect whether or not the amount of misalignment between the two substrates 211 and 213 is equal to or less than the threshold, and if it is equal to or less than the threshold, the combination may be determined to be appropriate.

Figure 28:
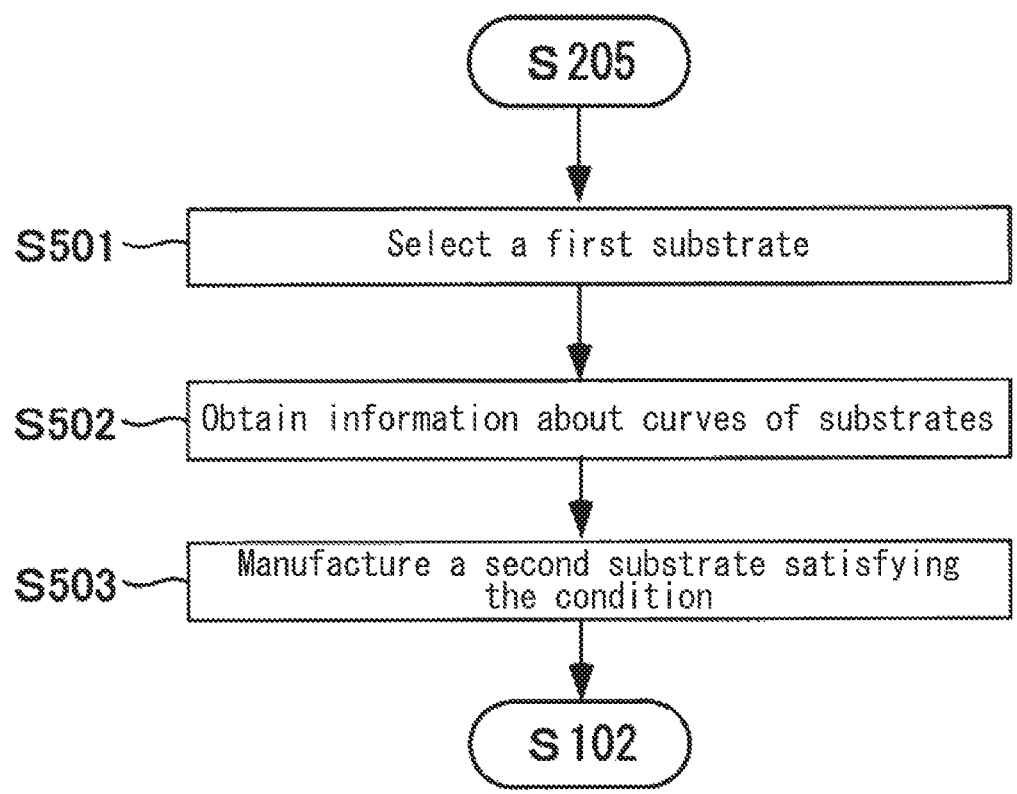
FIG. 28 shows a flow diagram showing a procedure to determine a combination of the substrate 210.

FIG. 28 shows a flow diagram to describe another procedure of the countermeasure performed in step S205 (FIG. 14). First, the controlling unit 150 selects any first substrate 213 among a group of substrates 210 whose information about the curving is collected (step S501). Note that, the combination selected in the step S501 is the substrate 213 which was taken out from the combinations determined not to satisfy the condition in step S204 (FIG. 14).

Next, the controlling unit 150 obtains information about the curving measured in step S201 (FIG. 14) for the selected first substrate 213 (step S502). Thus, the controlling unit 150 can calculate the magnification ratio of the second substrate 211 which satisfies the predetermined condition when the second substrate 211 is combined to this first substrate 213. Then, the controlling unit 150 outputs information indicating the required specification for the second substrate 211 to the manufacturing equipment of the substrates 211 and 213, which manufactures the second substrate 211 which can satisfy the condition when combined to the selected first substrate 213 to form the stacked substrate 230 (step S503).

Thus, the stacked substrate 230 which surely satisfies the condition can be fabricated from the first substrate 213 by manufacturing the second substrate 211 which is intended to be combined to the first substrate 213. It is noted that in step S503, as an alternative to manufacturing the second substrate 211 to be combined to the first substrate 213, if a substrate 210 which is stored in another lot or another line whose combination cannot be found is suited for the first substrate 213, it may be used.

Further, if a substrate 210 to be combined cannot be determined, a substrate 210 having an appropriate magnification ratio for the combination with the substrate 210 may be fabricated.

For example, the second substrate 211 whose difference in final magnification ratio from the existing first substrate 213 is equal to or less than the threshold may be manufactured later. In this case, the warpage amount of the substrate 211 whose final magnification ratio difference is equal to or less than the threshold may be calculated, and information about the warpage of the first substrate 213 may be fed back to the film deposition apparatus in the process from manufacturing the wafer to manufacturing the substrate 211 including film deposition in order to intentionally warp the substrate 211.

Thus, the throughput of overlaying the substrates 211 and 213 can be improved by preparing the substrates which does not cause a magnification ratio difference. In this case, the two substrates 211 and 213 may be manufactured with a target value of the warpage amount with which the magnification ratio difference between them is zero, and the error from the target value may be eliminated using a combination of the substrates 211 and 213 or a correction mechanism as described above.

Also, as for the substrate manufactured as described above, after the second substrate 211 to be combined to the first substrate 213 is determined, the substrate whose magnification ratio difference from the remained substrate is equal to or less than the threshold may be manufactured. Thus, the yield of the substrates 211 and 213 can be improved.

Also, as an alternative to this implementation which shows the example for determining whether or not the combination of first substrate 213 and the second substrate 211 satisfies the predetermined condition for the stacked substrate 230, it is also possible to individually determine whether or not each of the first substrate 213 and the second substrate 211 satisfies the predetermined condition. In this case, an example of the predetermined condition is that the distortion amount estimated to be generated in each of the first substrate 213 and the second substrate 211 in the bonding process, from the moment they are imported into the stacked substrate manufacturing apparatus 100 to the completion of the bonding, is equal to or less than the half of the width dimension of the connection terminal provided on each of the first substrate 213 and the second substrate 211. Alternatively, a curved state of each of the first substrate 213 and the second substrate 211 which satisfies this condition may be stored in advance, and whether or not the condition is satisfied may be determined from the measured curving states.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

100 stacked substrate manufacturing apparatus, 110 housing, 120, 130 substrate cassette, 140 conveying unit, 150 controlling unit, 210, 211, 213 substrate, 212 scribe line, 214 notch, 216 circuit region, 218 alignment mark, 220, 221, 222, 223 substrate holder, 225 retaining surface, 426 opening, 230 stacked substrate, 300 overlaying unit, 310 frame, 312 base plate, 316 ceiling plate, 322 upper stage, 324, 334 microscope, 326, 336 activation apparatus, 331 X-direction driving unit, 332 lower stage, 333 Y-direction driving unit, 338 lift driving unit, 400 holder stocker, 411 base, 412 actuator, 413 attracting unit, 414 support column, 415 pump, 416, 424 valve, 422 pressure source, 427 pressurized fluid, 432 voltage source, 434 switch, 436 electrostatic chuck, 500 prealigner, 601, 603, 602 correcting unit

What is claimed is:

1. A stacked substrate manufacturing method by bonding a first substrate and a second substrate, the stacked substrate manufacturing method comprising:
obtaining information about curving of the first substrate; and
at least one of:
(i) estimating, based on the information about curving, an amount of distortion occurring in the first substrate while a contact region formed between the first substrate and the second substrate is spreading; and
(ii) calculating, based on the information about curving, an amount of misalignment between the first substrate and the second substrate, the misalignment occurring while the contact region formed between the first substrate and the second is spreading.

2. The stacked substrate manufacturing method according to claim 1, wherein the information includes information indicating at least one of a warpage magnitude, a warpage direction, a deflection magnitude, and a deflection direction of the first substrate.

3. The stacked substrate manufacturing method according to claim 2, wherein the information includes information about global curving obtained from displacements at a plurality of positions relative to a center of the first substrate.

4. The stacked substrate manufacturing method according to claim 1, wherein the obtaining includes estimating the information based on a stacking process of the first substrate.

5. The stacked substrate manufacturing method according to claim 1, wherein the information includes information indicating a manufacturing process of the first substrate.

6. The stacked substrate manufacturing method according to claim 1, wherein the information includes information indicating a stress distribution in the first substrate.

7. The stacked substrate manufacturing method according to claim 1, wherein the information includes information indicating a specification of a structural body fabricated on the first substrate.

8. The stacked substrate manufacturing method according to claim 1, further comprising:
determining whether or not the first substrate and the second substrate satisfy a predetermined condition; and
bonding the first substrate and the second substrate if the predetermined condition is satisfied.

9. The stacked substrate manufacturing method according to claim 8, wherein the predetermined condition includes such a condition that the amount of misalignment is equal to or less than a threshold.

10. The stacked substrate manufacturing method according to claim 8, wherein
the information includes a distortion state of the first substrate and a distortion state of the second substrate, and
the predetermined condition includes such a condition that a combination of the distortion state of the first substrate and the distortion state of the second substrate corresponds to a predetermined combination.

11. The stacked substrate manufacturing method according to claim 8, wherein
if the predetermined condition is not satisfied in the determining, the method further comprises
changing a shape of at least one of the first substrate and the second substrate in such a manner that the amount of misalignment is equal to or less than a threshold while the contact region is spreading.

12. The stacked substrate manufacturing method according to claim 8, wherein
if the predetermined condition is not satisfied in the determining, the method further comprises
selecting, instead of the second substrate which is determined not to satisfy the predetermined condition, a different second substrate from a plurality of other second substrates which achieves the amount of misalignment equal to or less than a threshold while a contact region formed between the different second substrate and the first substrate is spreading.

13. The stacked substrate manufacturing method according to claim 8, wherein
if the predetermined condition is not satisfied in the determining, the method further comprises manufacturing the first substrate and the second substrate which achieve the amount of misalignment equal to or less than a threshold after the first substrate is bonded to the second substrate.

14. The stacked substrate manufacturing method according to claim 13, further comprising:
manufacturing the second substrate which achieves a magnification ratio of the second substrate which is bonded to the first substrate within a predetermined range relative to a magnification ratio of the first substrate.

15. The stacked substrate manufacturing method according to claim 8, wherein
the predetermined condition includes such a condition that the amount of misalignment between the first substrate and the second substrate which are bonded to each other, or a difference between the amount of misalignment and a threshold has a magnitude which can be corrected by a correcting unit which is configured to correct the misalignment between the first substrate and the second substrate.

16. The stacked substrate manufacturing method according to claim 8, wherein
the amount of distortion includes a magnification ratio, and
the predetermined condition includes such a condition that a difference between the magnification ratio of the first substrate and the magnification ratio of the second substrate is equal to or less than a threshold.

17. The stacked substrate manufacturing method according to claim 1, wherein the estimating of the amount of distortion occurring in the first substrate while the contact region is spreading includes estimating the amount of distortion occurring in the first substrate when the first substrate and the second substrate are flattened.

18. The stacked substrate manufacturing method according to claim 1, wherein the amount of misalignment is one of (i) a distance between an alignment mark on the first substrate and a corresponding alignment mark on the second substrate and (ii) a distance between a connection portion on the first substrate and a corresponding connection portion on the second substrate.

19. The stacked substrate manufacturing method according to claim 1, further comprising
calculating, based on the information, a correction amount that causes the amount of misalignment between the first substrate and the second substrate which are bonded to each other to be equal to or less than a threshold.

20. The stacked substrate manufacturing method according to claim 1, wherein the obtaining the information about curving of the first substrate includes measuring residual stress of the first substrate while the first substrate is forcibly flattened by attracting the first substrate to a substrate holder.

21. The stacked substrate manufacturing method according to claim 1, wherein the obtaining the information about curving of the first substrate includes measuring a magnitude of deflection of the first substrate by measuring a position of a front surface or a back surface of the first substrate while supporting the first substrate at a center thereof and rotating the first substrate around the center.

22. The stacked substrate manufacturing method according to claim 21, wherein the obtaining the information about curving of the first substrate further includes calculating a magnitude of warpage of the first substrate by subtracting a magnitude of deflection of a substrate without warpage from the magnitude of deflection of the first substrate.

23. The stacked substrate manufacturing method according to claim 1, wherein the information about curving of the first substrate is obtained by an apparatus that is different from an apparatus configured to bond the first substrate and the second substrate.

24. A stacked substrate manufacturing apparatus to manufacture a stacked substrate by bonding a first substrate and a second substrate, the stacked substrate manufacturing apparatus comprising:
an obtaining unit to obtain information about curving of the first substrate; and
an estimating unit to at least one of (i) estimate, based on the information about curving, an amount of distortion occurring in the first substrate while a contact region formed between the first substrate and the second substrate is spreading, and (ii) calculate, based on the information about curving, an amount of misalignment between the first substrate and the second substrate, the misalignment occurring while the contact region formed between the first substrate and the second substrate is spreading.

25. The stacked substrate manufacturing apparatus according to claim 24, further comprising
a determining unit to determine whether or not the first substrate and the second substrate satisfy a predetermined condition, wherein
when the predetermined condition is not satisfied, the determining unit selects, instead of the second substrate which is determined not to satisfy the predetermined condition, a different second substrate from a plurality of other second substrates which achieves the amount of misalignment equal to or less than a predetermined value while a contact region formed between the different second substrate and the first substrate is spreading.

26. The stacked substrate manufacturing apparatus according to claim 24, further comprising:
a determining unit to determine whether or not the first substrate and the second substrate satisfy a predetermined condition; and
a correcting unit to, if the predetermined condition is not satisfied, change and correct a shape of at least one of the first substrate and the second substrate in such a manner that the amount of misalignment is equal to or less than a predetermined value while the contact region is spreading.

27. A stacked substrate manufacturing system comprising:
a substrate processing apparatus to process a first substrate and a second substrate; and
a bonding apparatus to bond the first substrate and the second substrate which are processed in the substrate processing apparatus,
wherein the substrate processing apparatus includes:
an obtaining unit to obtain information about curving of the first substrate; and
an estimating unit to at least one of (i) estimate, based on the information about curving, an amount of distortion occurring in the first substrate while a contact region formed between the first substrate and the second substrate is spreading, and (ii) calculate, based on the information about curving, an amount of misalignment between the first substrate and the second substrate, the misalignment occurring while the contact region formed between the first substrate and the second substrate is spreading.

28. The stacked substrate manufacturing system according to claim 27, further comprising:

a determining unit to determine whether or not the first substrate and the second substrate satisfy a predetermined condition; and a controlling unit to output, to the bonding apparatus, an indication signal to cause the first substrate and the second substrate which satisfy the predetermined condition to be bonded, wherein when determining that the predetermined condition is not satisfied, the determining unit selects a different second substrate from a plurality of other second substrates which achieves the amount of misalignment equal to or less than a threshold while a contact region formed between the different second substrate and the first substrate is spreading, and the controlling unit outputs, to the bonding apparatus, an indication signal which causes the second substrate selected by the determining unit and the first substrate to be bonded.

29. A stacked substrate manufacturing method by bonding a first substrate and a second substrate, the stacked substrate manufacturing method comprising:

obtaining information about curving of the first substrate; and at least one of:
(i) estimating, based on the information about curving, an amount of distortion occurring in the first substrate while a contact region formed between the first substrate and the second substrate is spreading; and
(ii) calculating, based on the information about curving, an amount of misalignment between the first substrate and the second substrate, the misalignment occurring while the contact region formed between the first substrate and the second substrate is spreading, wherein the first substrate is released from a first substrate holder holding the first substrate, while the first substrate and the second substrate are bonding to each other.

30. A stacked substrate manufacturing method by bonding a first substrate and a second substrate, the stacked substrate manufacturing method comprising:

calculating, based on at least one of information about curving of the first substrate, an amount of distortion estimated to occur in the first substrate while a contact region formed between the first substrate and the second substrate is spreading, and a correction amount that causes an amount of misalignment between the first substrate and the second substrate to be equal to or less than a threshold, the misalignment occurring while the contact region formed between the first substrate and the second substrate is spreading;

determining whether or not the first substrate and the second substrate satisfy a predetermined condition; and bonding the first substrate and the second substrate if the predetermined condition is satisfied.

31. The stacked substrate manufacturing method according to claim 30, wherein the information includes a distortion state of the first substrate and a distortion state of the second substrate, and the predetermined condition includes such a condition that a combination of the distortion state of the first substrate and the distortion state of the second substrate corresponds to a predetermined combination.

32. A stacked substrate manufacturing apparatus to manufacture a stacked substrate by bonding a first substrate and a second substrate, the stacked substrate manufacturing apparatus comprising:

an obtaining unit to obtain information about curving of the first substrate; and an estimating unit to at least one of (i) estimate, based on the information about curving, an amount of distortion occurring in the first substrate while a contact region formed between the first substrate and the second substrate is spreading, and (ii) calculate, based on the information about curving, an amount of misalignment between the first substrate and the second substrate, the misalignment occurring while the contact region formed between the first substrate and the second substrate is spreading, wherein the first substrate is released from a first substrate holder holding the first substrate, while the first substrate and the second substrate are bonding to each other.

33. A stacked substrate manufacturing method by bonding a first substrate and a second substrate, the stacked substrate manufacturing method comprising:

determining a bonding condition for bonding the first substrate and the second substrate based on at least one of (i) an amount of distortion estimated to occur in the first substrate while a contact region formed between the first substrate and the second substrate is spreading and (ii) an amount of misalignment estimated to occur between the first substrate and the second substrate, the misalignment occurring while the contact region formed between the first substrate and the second substrate is spreading; and bonding the first substrate and the second substrate according to the determined bonding condition.

34. A stacked substrate manufacturing system comprising:

a substrate processing apparatus to process a first substrate and a second substrate, the substrate processing apparatus including:
a determining unit to determine a bonding condition for bonding the first substrate and the second substrate based on at least one of (i) an amount of distortion estimated to occur in the first substrate while a contact region formed between the first substrate and the second substrate is spreading and (ii) an amount of misalignment estimated to occur between the first substrate and the second substrate, the misalignment occurring while the contact region formed between the first substrate and the second substrate is spreading, and a bonding apparatus to bond the first substrate and the second substrate which are processed in the substrate processing apparatus according to the determined bonding condition.

* * * * *